United States Patent
Kakinuma et al.

(10) Patent No.: US 10,627,650 B2
(45) Date of Patent: Apr. 21, 2020

(54) OPTICAL MATERIAL AND USE THEREOF

(71) Applicants: MITSUI CHEMICALS, INC., Minato-ku, Tokyo (JP); YAMAMOTO CHEMICALS, INC., Yao-shi, Osaka (JP)

(72) Inventors: Naoyuki Kakinuma, Omuta (JP); Toshiya Hashimoto, Ichihara (JP); Satoshi Kinoshita, Yao (JP); Hiroyuki Sasaki, Yao (JP)

(73) Assignees: MITSUI CHEMICALS, INC., Minato-Ku, Tokyo (JP); YAMAMOTO CHEMICALS, INC., Yao-Shi, Osaka (JP)

(*) Notice: Subject to any disclaimer, the term of this patent is extended or adjusted under 35 U.S.C. 154(b) by 777 days.

(21) Appl. No.: 14/917,317

(22) PCT Filed: Sep. 10, 2014

(86) PCT No.: PCT/JP2014/073956
§ 371 (c)(1),
(2) Date: Mar. 8, 2016

(87) PCT Pub. No.: WO2015/037628
PCT Pub. Date: Mar. 19, 2015

(65) Prior Publication Data
US 2016/0223839 A1 Aug. 4, 2016

(30) Foreign Application Priority Data

Sep. 10, 2013 (JP) .................. 2013-187736

(51) Int. Cl.
*G02C 7/10* (2006.01)
*G02B 1/04* (2006.01)
(Continued)

(52) U.S. Cl.
CPC ............ *G02C 7/108* (2013.01); *C08K 5/0041* (2013.01); *C08K 5/0091* (2013.01);
(Continued)

(58) Field of Classification Search
CPC .... G02C 7/108; G02C 7/104; G02C 2202/16; C09B 47/00; C09B 47/045; C09B 47/061;
(Continued)

(56) References Cited

U.S. PATENT DOCUMENTS 5,912,257 A 6/1999 Prasad et al.
7,520,607 B2 4/2009 Casper et al.
(Continued)

FOREIGN PATENT DOCUMENTS

CN 1434771 A 8/2003
CN 1836176 A 9/2006
(Continued)

OTHER PUBLICATIONS

Extended Search Report issued by the European Patent Office in related European Patent Application No. 14844391.4 dated Mar. 23, 2017 (6 pages).
(Continued)

*Primary Examiner* — Eli D. Strah
(74) *Attorney, Agent, or Firm* — Buchanan, Ingersoll & Rooney PC

(57) ABSTRACT

An optical material of the present invention has a minimum transmittance value in a wavelength range of 445 nm to 470 nm of a transmittance curve measured at a thickness of 2 mm of the optical material.

7 Claims, 3 Drawing Sheets

(51) Int. Cl.
*C08L 101/00* (2006.01)
*C08K 5/00* (2006.01)
*C09B 47/04* (2006.01)
*G02B 5/22* (2006.01)
*H01L 51/00* (2006.01)
*C09B 47/067* (2006.01)
*C09B 47/00* (2006.01)
*C09B 47/06* (2006.01)

(52) U.S. Cl.
CPC .......... *C08L 101/00* (2013.01); *C09B 47/045* (2013.01); *G02B 1/04* (2013.01); *G02B 1/041* (2013.01); *G02B 5/223* (2013.01); *G02C 7/104* (2013.01); *B01J 2531/025* (2013.01); *C09B 47/00* (2013.01); *C09B 47/04* (2013.01); *C09B 47/061* (2013.01); *C09B 47/0671* (2013.01); *G02B 5/22* (2013.01); *G02C 2202/16* (2013.01); *G02F 2202/04* (2013.01); *H01L 51/0062* (2013.01); *H01L 51/0067* (2013.01); *H01L 51/0071* (2013.01); *H01L 51/0072* (2013.01); *H01L 51/0077* (2013.01); *H01L 51/0079* (2013.01); *H01L 51/0083* (2013.01); *H01L 51/0084* (2013.01)

(58) Field of Classification Search
CPC ..... C09B 47/04; C09B 47/0671; G02B 5/223; G02B 5/22; G02B 1/04; G02B 1/041; C08K 5/0041; C08K 5/0091; C08L 101/00; G02F 2202/04; H01L 51/0062; H01L 51/0067; H01L 51/0071; H01L 51/0072; H01L 51/0077; H01L 51/0079; H01L 51/0083; H01L 51/0084; B01J 2531/025
See application file for complete search history.

(56) References Cited

U.S. PATENT DOCUMENTS

| | | |
|---|---|---|
| 7,748,845 B2 | 7/2010 | Casper et al. |
| 2003/0194646 A1 | 10/2003 | Ogiso et al. |
| 2006/0119954 A1 | 6/2006 | Casper et al. |
| 2006/0257760 A1 | 11/2006 | Mori et al. |
| 2007/0293666 A1 | 12/2007 | Minami et al. |
| 2008/0065177 A1 | 3/2008 | Casper et al. |
| 2010/0063566 A1 | 3/2010 | Uchiumi et al. |

FOREIGN PATENT DOCUMENTS

| | | | |
|---|---|---|---|
| CN | 101048411 A | | 10/2007 |
| JP | 6-72151 A | | 3/1994 |
| JP | 7-304257 A | | 11/1995 |
| JP | 07304257 A | * | 11/1995 |
| JP | 2004-045887 A | | 2/2004 |
| JP | 2004045887 A | * | 2/2004 |
| JP | 2004-163839 A | | 6/2004 |
| JP | 2005-289812 A | | 10/2005 |
| JP | 2005-338661 A | | 12/2005 |
| JP | 2006-079012 A | | 3/2006 |
| JP | 2008-239592 A | | 10/2008 |
| JP | 2010-535538 A | | 11/2010 |
| JP | 2011-237730 A | | 11/2011 |
| JP | 2011237730 A | * | 11/2011 |
| JP | 2012-63715 A | | 3/2012 |
| JP | 2013-109257 A | | 6/2013 |
| WO | WO 2006/046497 A1 | | 5/2006 |
| WO | WO 2008-069101 A1 | | 6/2008 |

OTHER PUBLICATIONS

Sankar et al.: "Unusual solvent dependent electronic absorption spectral properties of nickel(II) and copper (II) perhaloporphyrins", Journal of Porphyrins and Phthalocyanines, vol. 08, No. 12, Dec. 1, 2004, pp. 1343-1355.

Rumyantseva et al.: "Synthesis and Spectral Luminescent Characteristics of the Porphyrin Complexes with the Platinum Group Metals", Russian Journal of Bioorganic Chemistry, vol. 34, No. 2, Mar. 1, 2008, pp. 239-244.

Extended Search Report issued by the European Patent Office in corresponding European Patent Application No. 14844494.6 dated May 16, 2017 (9 pages).

Office Action issued by The State Intellectual Property Office of People's Republic of China in corresponding Chinese Patent Application No. 201480048740.0 dated May 26, 2017 (20 pages including partial English translation).

International Search Report (PCT/ISA/210) dated Oct. 14, 2014, by the Japanese Patent Office as the International Searching Authority for International Application No. PCT/JP2014/073956.

Written Opinion (PCT/ISA/237) dated Oct. 14, 2014, by the Japanese Patent Office as the International Searching Authority for International Application No. PCT/JP2014/073956.

* cited by examiner

OPTICAL MATERIAL AND USE THEREOF

TECHNICAL FIELD

The present invention relates to an optical material and use thereof. More specifically, the present invention relates to a composition for an optical material and an optical product using a molded product which is formed by molding the composition for an optical material.

BACKGROUND ART

Human beings have a biological rhythm, which corresponds to the brightness and the darkness during the day and night, that is, a circadian rhythm in which sleeping and awakening are repeated at an almost daily cycle. A hormone called melatonin is related to this rhythm. Melatonin has an action of decreasing the body temperature and promoting sleep, but secretion of the hormone is suppressed by being exposed to strong light at night. That is, it is suggested that light exposure at night disturbs the circadian rhythm, and therefore, there is a possibility that the light exposure causes poor health such as sleep disorders. For this reason, a countermeasure method is required which is effective, widely used, and inexpensive.

Patent Document 1 discloses a device and spectacles including an optical filter. Patent Document 1 discloses a method of maintaining a circadian rhythm using the disclosed device and spectacles.

Patent Document 2 discloses an optical filter which selectively absorbs light of a specific wavelength, and light shielding spectacles using the optical filter.

Patent Document 3 discloses a light source system and an illumination device using a plurality of luminescent materials. It is also disclosed that, according to Patent Document 3, it is possible to obtain an effect by adjusting the intensity of the luminescent materials while maintaining the brightness and the color of the luminescent materials. Patent Document 4 discloses a display filter containing a specific porphyrin compound. Patent Document 5 discloses a spectacle lens containing a specific porphyrin compound.

RELATED DOCUMENT

Patent Document

[Patent Document 1] PCT Japanese Translation Patent Publication No. 2010-535538
[Patent Document 2] Japanese Unexamined Patent Publication No. 2012-63715
[Patent Document 3] Pamphlet of International Publication No. WO2008/69101
[Patent Document 4] Japanese Unexamined Patent Publication No. 2008-239592
[Patent Document 5] Japanese Unexamined Patent Publication No. 2011-237730

SUMMARY OF THE INVENTION

However, the device and the spectacles disclosed in Patent Document 1 use an optical film which absorbs a specific wavelength. Among these, the spectacles are required to be coated with 10 or more layers and the process is complicated, and therefore, the spectacles are not widely used.

In paragraph 0023 of Patent Document 2, an optical filter which is produced using an optical multilayer film, an optical filter formed of a volume phase type hologram, and an optical filter formed of a transparent material in which metal microparticles are mixed are disclosed. However, there is no disclosure of blocking absorption of light of around 460 nm and there are many problems in that metal microparticles have to be used, and a production process are complicated, or the like.

In the illumination device disclosed in Patent Document 3, it is verified that the effect is obtained only indoors to which the illumination device is applied, and it is substantially impossible to obtain the same effect as that obtained indoors, when going out or the like.

In Patent Documents 4 and 5, there is no disclosure of blocking absorption of light at a specific wavelength of around 460 nm.

The present inventors have found an optical material in which it is possible to maintain a normal circadian rhythm by suppressing the inhibition of melatonin secretion due to light exposure at night, by selectively absorbing light in a wavelength range of 445 nm to 470 nm.

The present invention can be represented as follows.

[1] An optical material of which a transmittance curve measured at a thickness of 2 mm of the optical material has a minimum transmittance value in a wavelength range of 445 nm to 470 nm.

[2] The optical material according to [1], of which the transmittance curve measured at a thickness of 2 mm of the optical material satisfies the following characteristics (1) to (4), in which (1) the transmittance curve has a maximum transmittance value in a wavelength range of 400 nm to 440 nm and the maximum transmittance thereof is 50% or more, in which (2) the transmittance curve has a minimum transmittance value in a wavelength range of 445 nm to 470 nm, in which (3) the transmittance at a wavelength of 500 nm is 70% or more, and in which (4) the minimum transmittance value in the wavelength range of 445 nm to 470 nm is four-fifths or less of the transmittance at a wavelength of 500 nm.

[3] The optical material according to [1] or [2], including:
at least one kind of organic dyes which have an absorption peak in a wavelength range of 445 nm to 470 nm, in an absorption spectrum which is measured at an optical path length of 10 mm of a chloroform solution thereof at a concentration of 0.01 g/L, and the half-value width of the absorption peak is 10 nm or more and less than 50 nm.

[4] The optical material according to [1] or [2], including:
organic dyes which have an absorption peak in a range of 445 nm to 455 nm and organic dyes which have an absorption peak in a range of 460 nm to 470 nm, in an absorption spectrum which is measured at an optical path length of 10 mm of a chloroform solution thereof at a concentration of 0.01 g/L.

[5] The optical material according to [3] or [4],
in which the amount of the organic dyes is 5 ppm to 100 ppm.

[6] The optical material according to any one of [1] to [5], the optical material has a minimum transmittance value in a wavelength range of 455 nm to 465 nm.

[7] The optical material according to any one of [3] to [6], in which the organic dyes are comprised of at least one kind of compound selected from porphyrin-based compounds represented by the following General Formula (A);

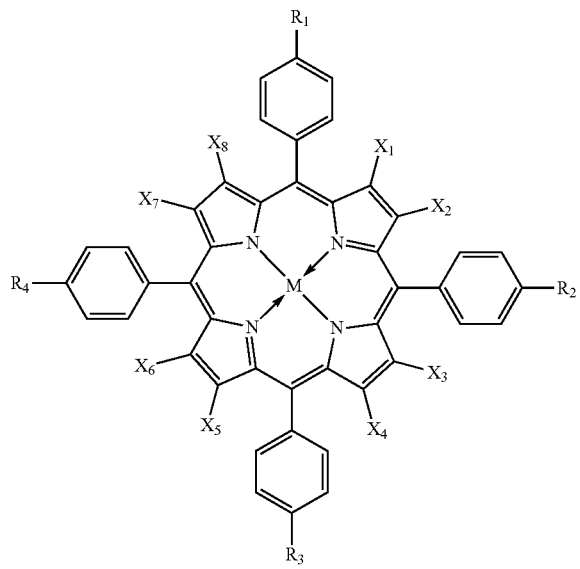

(A)

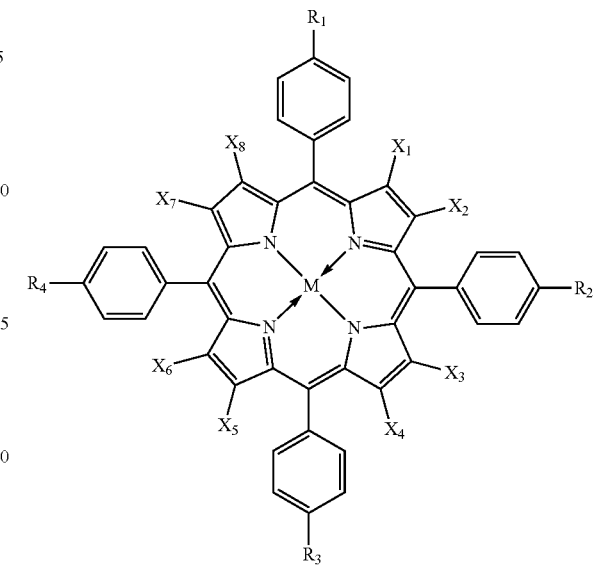

(A)

In the formula, $X_1$ to $X_8$ each independently represents a hydrogen atom; and a halogen atom. However, not all of $X_1$ to $X_8$ are hydrogen atoms. $R_1$ to $R_4$ each independently represents a hydrogen atom; and a straight or branched alkyl group. M represents two hydrogen atoms, a divalent metal atom, a trivalent substituted metal atom, a tetravalent substituted metal atom, a hydroxylated metal atom, or an oxidized metal atom.

[8] The optical material according to [7], in which the organic dyes are comprised of at least two kinds of compounds selected from porphyrin-based compounds represented by the above-described General Formula (A).

[9] The optical material according to [8], in which the organic dyes are a mixture of at least two kinds of compounds selected from porphyrin-based compounds represented by the above-described General Formula (A) and have an absorption peak in a range of 445 nm to 470 nm, in an absorption spectrum which is measured at an optical path length of 10 mm of a chloroform solution thereof at a concentration of 0.01 g/L.

[10] The optical material according to any one of [1] to [9], including: at least one kind selected from polyurethane, polythiourethane, polysulfide, polycarbonate, poly(meth)acrylate, and polyolefin.

[11] A composition for an optical material including:

a resin for an optical material or a resin monomer; and at least one kind of porphyrin-based compounds represented by the following General Formula (A) as organic dyes, in which the amount of the organic dyes is 0.0005 parts by weight to 0.01 parts by weight with respect to 100 parts by weight in total of the resin for an optical material or the resin monomer.

In the formula, $X_1$ to $X_8$ each independently represents a hydrogen atom; and a halogen atom. However, not all of $X_1$ to $X_8$ are hydrogen atoms. $R_1$ to $R_4$ each independently represents a hydrogen atom; and a straight or branched alkyl group. M represents two hydrogen atoms, a divalent metal atom, a trivalent substituted metal atom, a tetravalent substituted metal atom, a hydroxylated metal atom, or an oxidized metal atom.

[12] The composition for an optical material according to [11], in which the organic dyes are comprised of at least two kinds of compounds selected from porphyrin-based compounds represented by the above-described General Formula (A).

[13] The composition for an optical material according to [12], in which the organic dyes are a mixture of at least two kinds of compounds selected from porphyrin-based compounds represented by the above-described General Formula (A) and have an absorption peak in a range of 445 nm to 470 nm, in an absorption spectrum which is measured at an optical path length of 10 mm of a chloroform solution thereof at a concentration of 0.01 g/L.

[14] The composition for an optical material according to any one of [11] to [13], in which the resin for an optical material is at least one kind selected from polyurethane, polythiourethane, polysulfide, polycarbonate, poly(meth)acrylate, and polyolefin.

[15] A process for producing a molded product, including:

a step of mixing the organic dyes with the resin for an optical material or the resin monomer to obtain the composition for an optical material according to any one of [11] to [14]; and a step of curing the composition for an optical material.

[16] A molded product which is obtained by polymerizing and curing the composition for an optical material according to any one of [11] to [14].

[17] An optical material comprised of the molded product according to [16].

[18] A plastic spectacle lens comprised of the optical material according to any one of [1] to [10] and [17].

[19] A plastic spectacle lens, comprising:
a lens base material comprised of the optical material according to any one of [1] to [10] and [17].

[20] A film comprised of the molded product according to [16].

[21] A plastic spectacle lens, comprising:
a lens base material, and
a film layer over at least one surface of the lens base material,
in which the film layer is comprised of the film according to [20].

[22] A plastic spectacle lens comprising:
a lens base material, and
a coating layer over at least one surface of the lens base material,
in which the coating layer is comprised of the composition for an optical material according to any one of [11] to [14].

According to the optical material of the present invention, it is possible to maintain a normal circadian rhythm by suppressing the inhibition of melatonin secretion due to light exposure at night, by selectively absorbing light in a wavelength range of 445 nm to 470 nm. Moreover, according to the optical material of the present invention, it is possible to provide a plastic spectacle lens for an optical material or the like which exhibits an excellent effect of suppressing the inhibition of melatonin at night.

In addition, the optical material of the present invention contains organic dyes which selectively absorb light of a specific wavelength, and therefore, can be easily produced industrially.

BRIEF DESCRIPTION OF THE DRAWINGS

The above-described purposes and other purposes, and characteristics and advantages will be made clearer through suitable embodiments to be described below and the following accompanying drawings.

DESCRIPTION OF EMBODIMENTS

Figure 1:
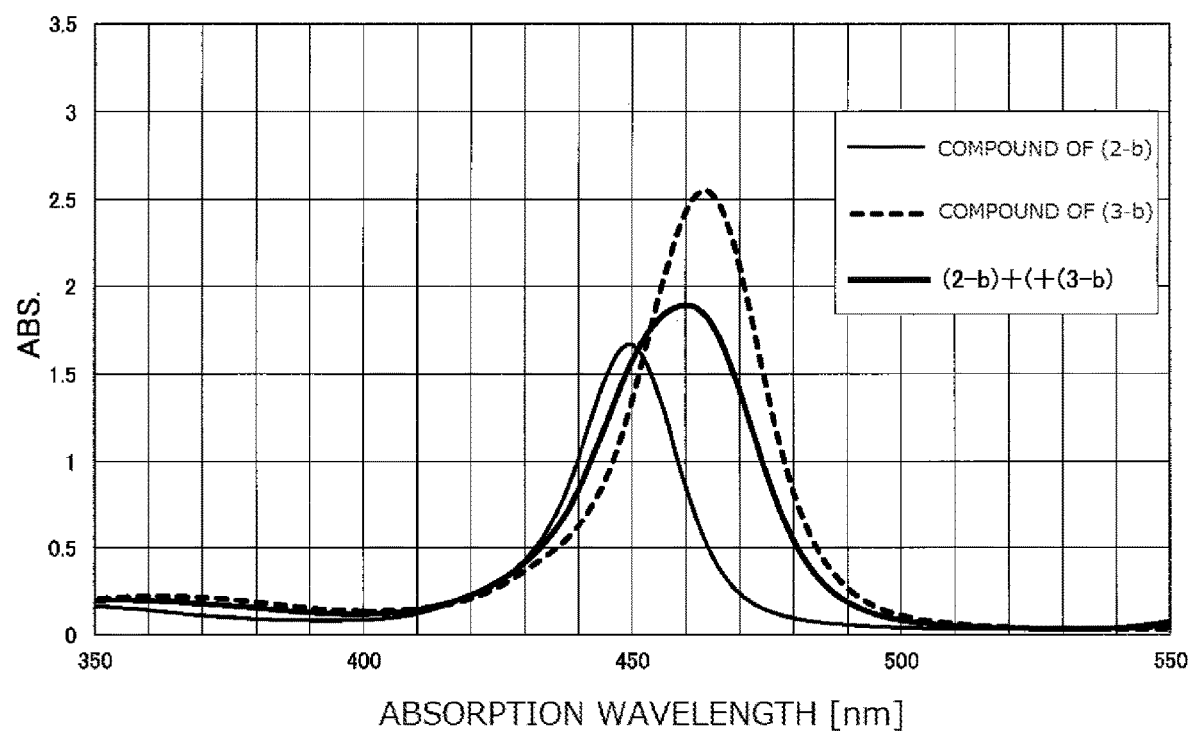
FIG. 1 shows absorption spectra of a compound of (2-b) obtained in Synthesis Example 1, a compound of (3-b) obtained in Synthesis Example 2, and a mixture thereof.

Hereinafter, an embodiment of an optical material according to the present invention will be described in detail.
[Optical Material]
An optical material of the present embodiment has a minimum transmittance value in a wavelength range of 445 nm to 470 nm of a transmittance curve measured at a thickness of 2 mm of the optical material. Preferably, the optical material of the present embodiment has a minimum transmittance value in a wavelength range of 455 nm to 465 nm.

This optical material satisfies such conditions of transmittance, and therefore, it is possible to suppress the inhibition of melatonin secretion due to light exposure at night and to maintain a normal circadian rhythm. Moreover, the optical material of the present embodiment can provide a plastic spectacle lens for an optical material or the like which exhibits the above-described effect.

It is more preferable that the optical material of the present embodiment satisfies the following (1) to (4) in a transmittance curve which is measured at a thickness of 2 mm of the optical material.

(1) The transmittance curve has a maximum transmittance value in a wavelength range of 400 nm to 440 nm and preferably in a wavelength range of 420 nm to 440 nm, and the maximum transmittance thereof is 50% or more.

(2) The transmittance curve has a minimum transmittance value in a wavelength range of 445 nm to 470 nm and preferably in a wavelength range of 455 nm to 465 nm.

(3) The transmittance at a wavelength of 500 nm is preferably 70% or more and more preferably 75% or more.

(4) The minimum transmittance value in the wavelength range of 445 nm to 470 nm and preferably in the wavelength range of 455 nm to 465 nm is four-fifths or less of the transmittance at 500 nm.

The optical material of the present embodiment having the above-described characteristics can contain at least one kind of organic dye which has an absorption peak in a wavelength range of 445 nm to 470 nm, in an absorption spectrum which is measured at an optical path length of 10 mm of a chloroform solution thereof at a concentration of 0.01 g/L, and the half-value width of the absorption peak is 10 nm or more and less than 50 nm.

First, the organic dyes will be described below.

[Organic Dyes]

The organic dyes contained in the optical material of the present embodiment are not particularly limited as long as the organic dyes satisfy the above-described spectrum characteristics measured under the conditions, and it is preferable that the organic dyes have an absorption peak in a range of 445 nm to 470 nm. At least two kinds of the organic dyes can also be mixed with each other.

In a case of mixing at least two kinds thereof with each other, it is preferable to use, for example, an organic dye which has an absorption peak in a range of 445 nm to 455 nm and an organic dye which has an absorption peak in a range of 460 nm to 470 nm. The weight ratio of these organic dyes is not particularly limited as long as there is an absorption peak in a wavelength range of 445 nm to 470 nm in the mixture. However, in a case of using a porphyrin-based compound, an organic dye b which has an absorption peak in a range of 460 nm to 470 nm with respect to an organic dye a which has an absorption peak in a range of 445 nm to 455 nm (organic dye b/organic dye a) is preferably 0.5 to 2 and more preferably 1.0 to 1.5.

Preferred examples of the organic dyes in the present embodiment include a porphyrin-based compound. The porphyrin-based compound is represented by the following General Formula (A).

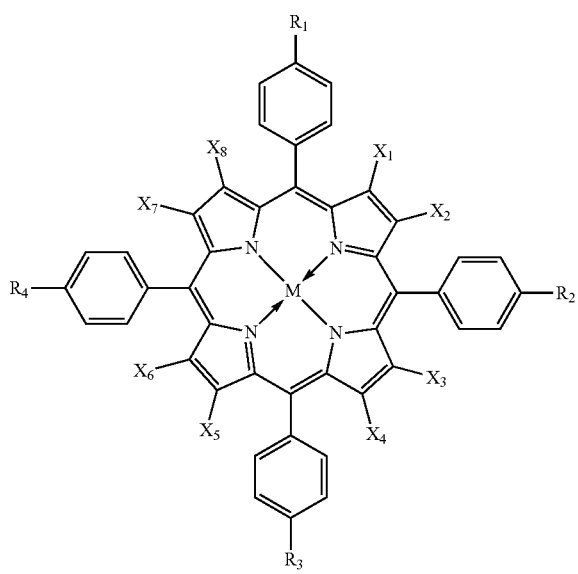

(A)

In the formula, $X_1$ to $X_8$ each independently represents a hydrogen atom, and a halogen atom. However, not all of $X_1$ to $X_8$ are hydrogen atoms. $R_1$ to $R_4$ each independently represents a hydrogen atom, and a straight or branched alkyl group. M represents two hydrogen atoms, a divalent metal atom, a trivalent substituted metal atom, a tetravalent substituted metal atom, a hydroxylated metal atom, or an oxidized metal atom.

$X_1$ to $X_8$ each independently represents a hydrogen atom; and a halogen atom such as a fluorine atom, a chlorine atom, a bromine atom, and an iodine atom, preferably include a fluorine atom, a chlorine atom, and a bromine atom, and particularly preferably include a fluorine atom and a bromine atom.

Preferably, $R_1$ to $R_4$ each independently represents a hydrogen atom; and a C1-C8 straight or branched alkyl group.

In addition, M is preferably Cu, Zn, Fe, Co, Ni, Pt, Pd, Mn, Mg, Mn(OH), Mn(OH)$_2$, VO, or TiO and more preferably Ni, Pd, or VO.

In a case where $R_1$ to $R_4$ are straight or branched alkyl groups, examples of the straight or branched alkyl groups include a methyl group, an ethyl group, an n-propyl group, an isopropyl group, an n-butyl group, an isobutyl group, a tert-butyl group, an n-pentyl group, an isopentyl group, an neopentyl group, a tert-pentyl group, a 1,2-dimethylpropyl group, a 1-methylbutyl group, a 2-methylbutyl group, an n-hexyl group, a 2-methylpentyl group, a 4-methylpentyl group, a 4-methyl-2-pentyl group, a 1,2-dimethylbutyl group, a 2,3-dimethylbutyl group, a 2-ethylbutyl group, an n-heptyl group, a 3-methylhexyl group, a 5-methylhexyl group, a 2,4-dimethyl pentyl group, an n-octyl group, a tert-octyl group, a 2-ethylhexyl group, a 2-propylpentyl group, and a 2,5-dimethylhexyl group.

Among these, a methyl group, an ethyl group, an n-propyl group, an isopropyl group, an n-butyl group, an isobutyl group, a tert-butyl group, an n-pentyl group, an isopentyl group, an neopentyl group, a 1,2-dimethylpropyl group, a 1-methylbutyl group, an n-hexyl group, a 1,2-dimethylbutyl group, a 2-ethylbutyl group, an n-heptyl group, an n-octyl group, and a 2-ethylhexyl group are preferable, and a methyl group, an ethyl group, an n-propyl group, an isopropyl group, an n-butyl group, an isobutyl group, a tert-butyl group, an n-pentyl group, an isopentyl group, an n-hexyl group, a 1,2-dimethylbutyl group, a 2-ethylbutyl group, an n-heptyl group, and an n-octyl group are more preferable.

The porphyrin-based compound used in the optical material of the present embodiment can be produced in consideration of a well-known method itself. For example, the porphyrin-based compound can be produced in accordance with a method disclosed in Octabromotetraphenylporphyrin and Its Metal Derivatives (Inorg. Chem. 1991, 30, 239-245).

In addition, the compound represented by General Formula (A) can be produced by, for example, synthesizing a compound represented by General Formula (B-1) to General Formula (B-4) and a compound represented by General Formula (C-1) to General Formula (C-4) through a dehydration condensation reaction and an oxidation reaction (for example, 2,3-dichloro-5,6-dicyano-1,4-benzoquinone), which is a so-called Rothemund reaction, using an acid catalyst (for example, propionic acid, a boron trifluoride-ethyl ether complex, and trifluoroacetic acid), and by reacting the synthesized compound with metal or a metal salt (for example, an acetylacetonate complex, or metal acetate) in an suitable solvent as desired.

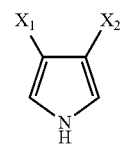

(B-1)

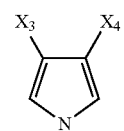

(B-2)

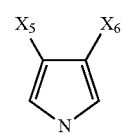

(B-3)

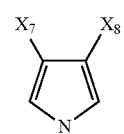

(B-4)

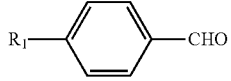

(C-1)

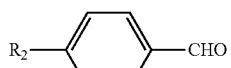

(C-2)

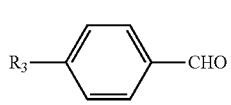

(C-3)

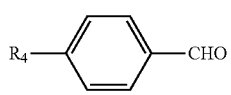

(C-4)

In the formula, $X_1$ to $X_8$ and $R_1$ to $R_4$ have the same meanings as in the case of General Formula (A).

In the present specification, the porphyrin-based compound represented by General Formula (A) actually represents a mixture comprised of one kind or at least two kinds of isomers. Even when describing a structure of such a mixture comprised of a plurality of isomers, in the present specification, one structural formula represented by General Formula (A) is described for convenience, for example.

In the case of mixing at least two kinds of porphyrin-based compounds as described above, the organic dye a having an absorption peak in a range of 445 nm to 455 nm is compound in which X is bromine and M is Ni or Pd, and the organic dye b having an absorption peak in a range of 460 nm to 470 nm is compound in which X is bromine and M is VO, for example.

In the optical material of the present embodiment, as the porphyrin-based compound, it is possible to use the mixture comprised of one kind or at least two kinds of isomers. In addition, it is possible to use one kind of compound within an isomer by separating the isomers from the mixture as desired. Furthermore, it is possible to use the plurality of isomers formed at arbitrary proportions, in combination. The porphyrin-based compound according to the present embodiment naturally includes crystals and also includes an amorphous material.

The optical material of the present embodiment has a minimum transmittance value in a wavelength range of 445 nm to 470 nm in a transmittance curve measured at a thickness of 2 mm of the optical material, and preferably includes the characteristics of (1) to (4).

The optical material of the present embodiment preferably contains porphyrin-based compounds as organic dyes. Specifically, the optical material of the present embodiment has an absorption maximum wavelength in a wavelength region between wavelengths of 445 nm to 470 nm, and in detail, contains at least one kind of compound which has an absorption peak in a wavelength range of 445 nm to 470 nm, in an absorption spectrum which is measured at an optical path length of 10 mm of a chloroform solution thereof at a concentration of 0.01 g/L, and the half-value width of the absorption peak is 10 nm or more and less than 50 nm.

The half-value width in the present specification indicates a full width at half maximum and is represented by a distance (nm) between two intersections which are formed by the peak and a straight line parallel to a horizontal axis which is drawn by a value of one-half of an absorption coefficient value (εg) in an absorption maximum wavelength in the absorption spectrum.

[Composition for Optical Material]

Next, a composition for an optical material of the present embodiment will be described in detail.

The composition for an optical material of the present embodiment contains a resin for an optical material or a resin monomer; and at least one kind of organic dyes which have an absorption peak in a range of 445 nm to 470 nm, in an absorption spectrum which is measured under the above-described conditions.

The organic dyes can be contained at an amount of 0.0005 parts by weight to 0.01 parts by weight and preferably 0.0005 parts by weight to 0.005 parts by weight with respect to 100 parts by weight of total of the resin for an optical material or the resin monomer.

By containing the above-described amount of the organic dyes, it is possible to suitably obtain the optical material satisfying the above-described characteristics (1) to (4).

As these organic dyes, it is possible to use the above-described organic dyes. Furthermore, a resin modifier or the like may be contained as another component.

First, the resin for an optical material or the resin for an optical material which is obtained from the resin monomer will be described.

In the present embodiment, it is possible to use the resin for an optical material without any restrictions as long as the resin for an optical material is a transparent resin.

Examples of the transparent resin include polyurethane, polythiourethane, polysulfide, polycarbonate, poly(meth) acrylate, polyolefin, cyclic polyolefin, polyallyl, polyurethane urea, a polyene-polythiol polymer, a ring-opening metathesis polymer, polyester, and an epoxy resin, and it is preferable to use at least one kind selected from polyurethane, polythiourethane, polysulfide, polycarbonate, poly (meth)acrylate, and polyolefin. These materials are materials having high transparency and can be suitably used for an optical material.

These materials may be used singly or as a composite material.

Polyurethane can be obtained from a polyisocyanate compound and a polyol compound which are resin monomers. Polythiourethane is comprised of a constituent unit derived from a polyisocyanate compound and a constituent unit derived from a polythiol compound. The composition for an optical material can contain these resin monomers constituting a resin.

Examples of the polyisocyanate compound include aliphatic polyisocyanate compounds such as 1,6-hexamethylene diisocyanate, 1,5-pentamethylene diisocyanate, 2,2,4-trimethylhexane diisocyanate, 2,4,4-trimethylhexamethylene diisocyanate, lysine diisocyanatomethyl ester, lysine triisocyanate, m-xylylene diisocyanate, α,α,α',α'-tetramethylxylylene diisocyanate, bis(isocyanatomethyl)naphthalene, mesitylene triisocyanate, bis(isocyanatomethyl)sulfide, bis(isocyanatoethyl)sulfide, bis(isocyanatomethyl)disulfide, bis(isocyanatoethyl)disulfide, bis(isocyanatomethylthio)methane, bis (isocyanatoethylthio)methane, bis(isocyanatoethylthio) ethane, and bis(isocyanatomethylthio)ethane; alicyclic polyisocyanate compounds such as isophorone diisocyanate, 1,3-bis(isocyanatomethyl)cyclohexane, 1,4-bis(isocyanatomethyl)cyclohexane, dicyclohexylmethane diisocyanate, cyclohexane diisocyanate, methylcyclohexane diisocyanate, dicyclohexyl dimethylmethane isocyanate, 2,5-bis (isocyanatomethyl)bicyclo-[2.2.1]-heptane, 2,6-bis (isocyanatomethyl)bicyclo-[2.2.1]-heptane, 3,8-bis (isocyanatomethyl)tricyclodecane, 3,9-bis (isocyanatomethyl)tricyclodecane, 4,8-bis (isocyanatomethyl)tricyclodecane, and 4,9-bis (isocyanatomethyl)tricyclodecane; aromatic polyisocyanate compounds such as naphthalene diisocyanate, m-phenylene diisocyanate, p-phenylene diisocyanate, 2,4-tolylene diisocyanate, 2,6-tolylene diisocyanate, biphenyl diisocyanate, diphenylmethane-2,2'-diisocyanate, diphenylmethane-2,4'-diisocyanate, diphenylmethane-4,4'-diisocyanate, benzene triisocyanate, and diphenylsulfide-4,4-diisocyanate; and heterocyclic polyisocyanate compounds such as 2,5-diisocyanatothiophene, 2,5-bis(isocyanatomethyl)thiophene, 2,5-diisocyanatotetrahydrothiophene, 2,5-bis(isocyanatomethyl) tetrahydrothiophene, 3,4-bis(isocyanatomethyl) tetrahydrothiophene, 2,5-diisocyanato-1,4-dithiane, 2,5-bis (isocyanatomethyl)-1,4-dithiane, 4,5-diisocyanato-1,3-dithiolane, and 4,5-bis(isocyanatomethyl)-1,3-dithiolane, and it is possible to use at least one kind selected therefrom.

The polyol compound is at least one kind of aliphatic or alicyclic alcohols. Specific examples thereof include straight or branched aliphatic alcohol, alicyclic alcohol, or alcohols obtained by adding these alcohols with ethylene oxide, propylene oxide, and ε-caprolactone, and it is possible to use at least one kind selected therefrom.

Examples of the straight or branched aliphatic alcohol include ethylene glycol, diethylene glycol, triethylene glycol, propylene glycol, dipropylene glycol, tripropylene glycol, 1,3-propanediol, 2,2-dimethyl-1,3-propanediol, 2,2-diethyl-1,3-propanediol, 1,2-butanediol, 1,3-butanediol, 1,4-butanediol, 3-methyl-1,3-butanediol, 1,2-pentanediol, 1,3-pentanediol, 1,5-pentanediol, 2,4-pentanediol, 2-methyl-2,4-pentanediol, 3-methyl-1,5-pentanediol, 1,6-hexanediol, 2,5-hexanediol, glycerol, diglycerol, polyglycerol, trimethylolpropane, pentaerythritol, and di(trimethylolpropane).

Examples of the alicyclic alcohol include 1,2-cyclopentane diol, 1,3-cyclopentanediol, 3-methyl-1,2-cyclopentanediol, 1,2-cyclohexanediol, 1,3-cyclohexanediol, 1,4-cyclohexanediol, 4,4'-bicyclohexanol, and 1,4-cyclohexane dimethanol, and it is possible to use at least one kind selected therefrom.

The compound may be a compound to which these alcohols, ethylene oxide, propylene oxide, and ε-caprolactone are added. Examples thereof include an ethylene oxide adduct of glycerol, ethylene oxide adduct of trimethylolpropane, ethylene oxide adduct of pentaerythritol, propylene oxide adduct of glycerol, propylene oxide adduct of trimethylolpropane, propylene oxide adduct of pentaerythritol, caprolactone-modified glycerol, caprolactone-modified trimethylolpropane, and caprolactone-modified pentaerythritol, and it is possible to use at least one kind selected from these.

Examples of the polythiol compound include aliphatic polythiol compounds such as methanedithiol, 1,2-ethanedithiol, 1,2,3-propane trithiol, 1,2-cyclohexane dithiol, bis(2-mercaptoethyl)ether, tetrakis(mercaptomethyl)methane, diethylene glycol bis(2-mercaptoacetate), diethylene glycol bis(3-mercaptopropionate), ethylene glycol bis(2-mercaptoacetate), ethylene glycol bis(3-mercaptopropionate), trimethylolpropane tris(2-mercaptoacetate), trimethylolpropane tris(3-mercaptopropionate), trimethylolethane tris(2-mercaptoacetate), trimethylolethane tris(3-mercaptopropionate), pentaerythritol tetrakis(2-mercaptoacetate), pentaerythritol tetrakis(3-mercaptopropionate), bis(mercaptomethyl)sulfide, bis(mercaptomethyl)disulfide, bis(mercaptoethyl)sulfide, bis(mercaptoethyl)disulfide, bis(mercaptopropyl)sulfide, bis(mercaptomethylthio)methane, bis(2-mercaptoethylthio)methane, bis(3-mercaptopropylthio)methane, 1,2-bis(mercaptomethylthio)ethane, 1,2-bis(2-mercaptoethylthio)ethane, 1,2-bis(3-mercaptopropylthio)ethane, 1,2,3-tris(mercaptomethylthio)propane, 1,2,3-tris(2-mercaptoethylthio)propane, 1,2,3-tris(3-mercaptopropylthio)propane, 4-mercaptomethyl-1,8-dimercapto-3,6-dithiaoctane, 5,7-dimercaptomethyl-1,11-dimercapto-3,6,9-trithiaundecane, 4,7-dimercaptomethyl-1,11-dimercapto-3,6,9-trithiaundecane, 4,8-dimercaptomethyl-1,11-dimercapto-3,6,9-trithiaundecane, tetrakis(mercaptomethylthiomethyl)methane, tetrakis(2-mercaptoethylthiomethyl)methane, tetrakis(3-mercaptopropylthiomethyl)methane, bis(2,3-dimercaptopropyl)sulfide, 2,5-dimercaptomethyl-1,4-dithiane, 2,5-dimercapto-1,4-dithiane, 2,5-dimercaptomethyl-2,5-dimethyl-1,4-dithiane, and esters of these thioglycolic acid and mercaptopropionic acid, hydroxymethyl sulfide bis(2-mercaptoacetate), hydroxymethyl sulfide bis(3-mercaptopropionate), hydroxyethyl sulfide bis(2-mercaptoacetate), hydroxyethyl sulfide bis(3-mercaptopropionate), hydroxymethyl disulfide bis(2-mercaptoacetate), hydroxymethyl disulfide bis(3-mercaptopropionate), hydroxyethyl disulfide bis(2-mercaptoacetate), hydroxyethyl disulfide bis(3-mercapto propionate), 2-mercaptoethyl ether bis(2-mercaptoacetate), 2-mercaptoethyl ether bis(3-mercaptopropionate), bis(2-mercaptoethyl ester) thiodiglycolate, bis(2-mercaptoethyl ester)thiodipropionate, bis(2-mercaptoethyl ester)dithiodiglycolate, bis(2-mercaptoethyl ester)dithiodipropionate, 1,1,3,3-tetrakis(mercaptomethylthio)propane, 1,1,2,2-tetrakis(mercaptomethylthio)ethane, 4,6-bis(mercaptomethylthio)-1,3-dithiane, tris(mercaptomethylthio)methane, and tris(mercaptoethylthio)methane; aromatic polythiol compounds such as 1,2-dimercaptobenzene, 1,3-dimercaptobenzene, 1,4-dimercaptobenzene, 1,2-bis(mercaptomethyl)benzene, 1,3-bis(mercaptomethyl)benzene, 1,4-bis(mercaptomethyl)benzene, 1,2-bis(mercaptoethyl)benzene, 1,3-bis(mercaptoethyl)benzene, 1,4-bis(mercaptoethyl)benzene, 1,3,5-trimercaptobenzene, 1,3,5-tris(mercaptomethyl)benzene, 1,3,5-tris(mercaptomethyleneoxy)benzene, 1,3,5-tris(mercaptoethyleneoxy)benzene, 2,5-toluenedithiol, 3,4-toluenedithiol, 1,5-naphthalenedithiol, and 2,6-naphthalenedithiol; and heterocyclic polythiol compounds such as 2-methylamino-4,6-dithiol-sym-triazine, 3,4-thiophenedithiol, bismuthiol, 2,5-bis(mercaptomethyl)-1,4-dithiane, 4,6-bis(mercaptomethylthio)-1,3-dithiane, and 2-(2,2-bis(mercaptomethylthio)ethyl)-1,3-dithietane, and it is possible to use at least one kind selected therefrom.

Examples of an arbitrary additive include a polymerization catalyst, an internal release agent, a bluing agent, and an ultraviolet absorber, and the like. In the present embodiment, when obtaining polyurethane and polythiourethane, a polymerization catalyst may or may not be used.

Examples of the internal release agent include acidic phosphoric acid ester. Examples of acidic phosphoric acid ester include phosphoric monoester and phosphoric diester, and these can be used singly or in combination of at least two kinds thereof. Examples of the bluing agent include a compound which has an absorption band from an orange wavelength region to a yellow wavelength region in a visible light region and has a function of adjusting the color of an optical material comprised of a resin. More specifically, the bluing agent contains a substance exhibiting a blue color to a violet color.

Examples of the ultraviolet absorber to be used include benzophenone-based ultraviolet absorbers such as 2,2'-dihydroxy-4-methoxybenzophenone, 2-hydroxy-4-acryloyloxy benzophenone, 2-hydroxy-4-acryloyloxy-5-tert-butylbenzophenone, and 2-hydroxy-4-acryloyloxy-2',4'-dichlorobenzophenone; triazine-based ultraviolet absorbers such as 2-[4-[(2-hydroxy-3-dodecyloxypropyl)oxy]-2-hydroxyphenyl]4,6-bis (2,4-dimethylphenyl)-1,3,5-triazine, 2-[4-[(2-hydroxy-3-tridecyloxypropyl)oxy]-2-hydroxyphenyl]-4,6-bis(2,4-dimethylphenyl)-1,3,5-triazine, 2-[4-[(2-hydroxy-3-(2'-ethyl)hexyl)oxy]-2-hydroxyphenyl]-4,6-bis (2,4-dimethylphenyl)-1,3,5-triazine, 2,4-bis(2-hydroxy-4-butyloxyphenyl)-6-(2,4-bis-butyloxyphenyl)-1,3,5-triazine, and 2-(2-hydroxy-4-[1-octyloxycarbonyl ethoxy]phenyl)-4,6-bis(4-phenylphenyl)-1,3,5-triazine; benzotriazole-based ultraviolet absorbers such as 2-(2H-benzotriazole-2-yl)-4-methylphenol, 2-(2H-benzotriazole-2-yl)-4-tert-octylphenol, 2-(2H-benzotriazole-2-yl)-4,6-bis(1-methyl-1-phenylethyl)phenol, 2-(2H-benzotriazole-2-yl)-4,6-di-tert-pentylphenol, 2-(5-chloro-2H-benzotriazole-2-yl)-4-methyl-6-tert-butylphenol, 2-(5-chloro-2H-benzotriazole-2-yl)-2,4-tert-butylphenol, and 2,2'-methylenebis[6-(2H-benzotriazole-2-yl)-4-(1,1,3,3-tetramethylbutyl)phenol], and preferred examples thereof include a benzotriazole-based ultraviolet absorber such as 2-(2H-benzotriazole-2-yl)-4-tert-octylphenol or 2-(5-chloro-2H-benzotriazole-2-yl)-4-methyl-6-tert-butylphenol. These ultraviolet absorbers can be used singly or in combination of at least two kinds thereof.

Polysulfide can be obtained by a method through ring-opening polymerization of a polyepithio compound or a polythietane compound which is a resin monomer. The composition for an optical material can contain a resin monomer constituting these resins.

Examples of the polyepithio compound include epithioethylthio compounds such as bis(1,2-epithioethyl)sulfide, bis(1,2-epithioethyl)disulfide, bis(epithioethylthio)methane, bis(epithioethylthio)benzene, bis[4-(epithioethylthio)phenyl]sulfide, and bis[4-(epithioethylthio)phenyl]methane; chain aliphatic 2,3-epithiopropylthio compounds such as bis(2,3-epithiopropyl)sulfide, bis(2,3-epithiopropyl)disulfide, bis(2,3-epithiopropylthio)methane, 1,2-bis(2,3-epithiopropylthio)ethane, 1,2-bis(2,3-epithiopropylthio)propane, 1,3-bis(2,3-epithiopropylthio)propane, 1,3-bis(2,3-epithiopropylthio)-2-methylpropane, 1,4-bis(2,3-epithiopropylthio)butane, 1,4-bis(2,3-epithiopropylthio)-2-methylbutane, 1,3-bis(2,3-epithiopropylthio)butane, 1,5-bis(2,3-epithiopropylthio)pentane, 1,5-bis(2,3-epithiopropylthio)-2-methylpentane, 1,5-bis(2,3-epithiopropylthio)-3-thiapentane, 1,6-bis(2,3-epithiopropylthio)hexane, 1,6-bis(2,3-epithiopropylthio)-2-methylhexane, 1,8-bis(2,3-epithiopropylthio)-3,6-dithiaoctane, 1,2,3-tris(2,3-epithiopropylthio)propane, 2,2-bis(2,3-epithiopropylthio)-1,3-bis(2,3-epithiopropylthiomethyl)propane, 2,2-bis(2,3-epithiopropylthiomethyl)-1-(2,3-epithiopropylthio)butane, 1,5-bis(2,3-epithiopropylthio)-2-(2,3-epithiopropylthiomethyl)-3-thiapentane, 1,5-bis(2,3-epithiopropylthio)-2,4-bis(2,3-epithiopropylthiomethyl)-3-thiapentane, 1-(2,3-epithiopropylthio)-2,2-bis(2,3-epithiopropylthiomethyl)-4-thiahexane, 1,5,6-tris(2,3-epithiopropylthio)-4-(2,3-epithiopropylthiomethyl-3-thiahexane, 1,8-bis(2,3-epithiopropylthio)-4-(2,3-epithiopropylthiomethyl)-3,6-dithiaoctane, 1,8-bis(2,3-epithiopropylthio)-4,5-bis(2,3-epithiopropylthiomethyl)-3,6-dithiaoctane, 1,8-bis(2,3-epithiopropylthio)-4,4-bis(2,3-epithiopropylthiomethyl)-3,6-dithiaoctane, 1,8-bis(2,3-epithiopropylthio)-2,5-bis(2,3-epithiopropylthiomethyl)-3,6-dithiaoctane, 1,8-bis(2,3-epithiopropylthio)-2,4,5-tris(2,3-epithiopropylthiomethyl)-3,6-dithiaoctane, 1,1,1-tris[[2-(2,3-epithiopropylthio)ethyl]thiomethyl]-2-(2,3-epithiopropylthio)ethane, 1,1,2,2-tetrakis[[2-(2,3-epithiopropylthio)ethyl]thiomethyl]ethane, 1,11-bis(2,3-epithiopropylthio)-4,8-bis(2,3-epithiopropylthiomethyl)-3,6,9-trithiaundecane, 1,11-bis(2,3-epithiopropylthio)-4,7-bis(2,3-epithiopropylthiomethyl)-3,6,9-trithiaundecane, and 1,11-bis(2,3-epithiopropylthio)-5,7-bis(2,3-epithiopropylthiomethyl)-3,6,9-trithiaundecane; cycloaliphatic 2,3-epithiopropylthio compounds such as 1,3-bis(2,3-epithiopropylthio)cyclohexane, 1,4-bis(2,3-epithiopropylthio)cyclohexane, 1,3-bis(2,3-epithiopropylthiomethyl)cyclohexane, 1,4-bis(2,3-epithiopropylthiomethyl)cyclohexane, 2,5-bis(2,3-epithiopropylthiomethyl)-1,4-dithiane, 2,5-bis[[2-(2,3-epithiopropylthio)ethyl]thiomethyl]-1,4-dithiane, and 2,5-bis(2,3-epithiopropylthiomethyl)-2,5-dimethyl-1,4-dithiane; aromatic 2,3-epithiopropylthio compounds such as 1,2-bis(2,3-epithiopropylthio)benzene, 1,3-bis(2,3-epithiopropylthio)benzene, 1,4-bis(2,3-epithiopropylthio)benzene, 1,2-bis(2,3-epithiopropylthiomethyl)benzene, 1,3-bis(2,3-epithiopropylthiomethyl)benzene, 1,4-bis(2,3-epithiopropylthiomethyl)benzene, bis[4-(2,3-epithiopropylthio)phenyl]methane, 2,2-bis[4-(2,3-epithiopropylthio)phenyl]propane, bis[4-(2,3-epithiopropylthio)phenyl]sulfide, bis[4-(2,3-epithiopropylthio)phenyl]sulfone, and 4,4'-bis(2,3-epithiopropylthio)biphenyl; chain aliphatic 2,3-epithiopropyloxy compounds such as bis(2,3-epithiopropyl)ether, bis(2,3-epithiopropyloxy)methane, 1,2-bis(2,3-epithiopropyloxy)ethane, 1,2-bis(2,3-epithiopropyloxy)propane, 1,3-bis(2,3-epithiopropyloxy)propane, 1,3-bis(2,3-epithiopropyloxy)-2-methylpropane, 1,4-bis(2,3-epithiopropyloxy)butane, 1,4-bis(2,3-epithiopropyloxy)-2-methylbutane, 1,3-bis(2,3-epithiopropyloxy)butane, 1,5-bis(2,3-epithiopropyloxy)pentane, 1,5-bis(2,3-epithiopropyloxy)-2-methylpentane, 1,5-bis(2,3-epithiopropyloxy)-3-thiapentane, 1,6-bis(2,3-epithiopropyloxy)hexane, 1,6-bis(2,3-epithiopropyloxy)-2-methylhexane, 1,8-bis(2,3-epithiopropyloxy)-3,6-dithiaoctane, 1,2,3-tris(2,3-epithiopropyloxy)propane, 2,2-bis(2,3-epithiopropyloxy)-1,3-bis(2,3-epithiopropyloxymethyl)propane, 2,2-bis(2,3-epithiopropyloxymethyl)-1-(2,3-epithiopropyloxy)butane, 1,5-bis(2,3-epithiopropyloxy)-2-(2,3-epithiopropyloxymethyl)-3-thiapentane, 1,5-bis(2,3-epithiopropyloxy)-2,4-bis(2,3-epithiopropyloxymethyl)-3-thiapentane, 1-(2,3-epithiopropyloxy)-2,2-bis(2,3-epithiopropyloxymethyl)-4-thiahexane, 1,5,6-tris(2,3-epithiopropyloxy)-4-(2,3-epithiopropyloxymethyl)-3-thiahexane, 1,8-bis(2,3-epithiopropyloxy)-4-(2,3-epithiopropyloxymethyl)-3,6-dithiaoctane, 1,8-bis(2,3-epithiopropyloxy)-4,5-bis(2,3-epithiopropyloxymethyl)-3,6-dithiaoctane, 1,8-bis(2,3-epithiopropyloxy)-4,4-bis(2,3-epithiopropyloxymethyl)-3,6-dithiaoctane, 1,8-bis(2,3-epithiopropyloxy)-2,5-bis(2,3-epithiopropyloxymethyl)-3,6-dithiaoctane, 1,8-bis(2,3-epithiopropyloxy)-2,4,5-tris(2,3-epithiopropyloxymethyl)-3,6-dithiaoctane, 1,1,1-tris[[2-(2,3-epithiopropyloxy)ethyl]thiomethyl]-2-(2,3-epithiopropyloxy)ethane, 1,1,2,2-tetrakis[[2-(2,3-epithiopropyloxy)ethyl]thiomethyl]ethane, 1,11-bis(2,3-epithiopropyloxy)-4,8-bis(2,3-epithiopropyloxymethyl)-3,6,9-trithiaundecane, 1,11-bis(2,3-epithiopropyloxy)-4,7-bis(2,3-epithiopropyloxymethyl)-3,6,9-trithiaundecane, and 1,11-bis(2,3-epithiopropyloxy)-5,7-bis(2,3-epithiopropyloxymethyl)-3,6,9-trithiaundecane; cycloaliphatic 2,3-epithiopropyloxy compounds such as 1,3-bis(2,3-epithiopropyloxy)cyclohexane, 1,4-bis(2,3-epithiopropyloxy)cyclohexane, 1,3-bis(2,3-epithiopropyloxy methyl)cyclohexane, 1,4-bis(2,3-epithiopropyloxy methyl)cyclohexane, 2,5-bis(2,3-epithiopropyloxy methyl)-1,4-dithiane, 2,5-bis[[2-(2,3-epithiopropyloxy)ethyl]thiomethyl]-1,4-dithiane, and 2,5-bis(2,3-epithiopropyloxymethyl)-2,5-dimethyl-1,4-dithiane; and aromatic 2,3-epithiopropyloxy compounds such as 1,2-bis(2,3-epithiopropyloxy)benzene, 1,3-bis(2,3-epithiopropyloxy)benzene, 1,4-bis(2,3-epithiopropyloxy)benzene, 1,2-bis(2,3-epithiopropyloxy methyl)benzene, 1,3-bis(2,3-epithiopropyloxy methyl)benzene, 1,4-bis(2,3-epithiopropyloxy methyl)benzene, bis[4-(2,3-epithiopropyloxy)phenyl]methane, 2,2-bis[4-(2,3-epithiopropyloxy)phenyl]propane, bis[4-(2,3-epithiopropyloxy)phenyl]sulfide, bis[4-(2,3-epithiopropyloxy)phenyl]sulfone, and 4,4'-bis(2,3-epithiopropyloxy)biphenyl.

As the polythietane compound, it is possible to use a metal-containing thietane compound or a non-metallic thietane compound.

These polythietane compounds contain at least one thietanyl groups within a molecule as disclosed in WO2005-95490 or Japanese Unexamined Patent Publication No.

2003-327583. These polythietane compounds are preferably compounds containing at least two thietanyl groups in total. Examples of the compounds include sulfide-based thietane compounds such as bisthietanyl sulfide, bis(3-thietanylthio) disulfide, bis(3-thietanylthio)methane, and 3-(((3'-thietanyl-thio)methylthio)methylthio)thietane; and polysulfide-based thietane compounds such as bis(3-thietanyl)disulfide, bis(3-thietanyl)trisulfide, bis(3-thietanyl)tetrasulfide, and bis(3-thietanyl)pentasulfide.

Polycarbonate can be obtained through a method for reacting an alcohol with phosgene or reacting an alcohol with chloroformate, or performing transesterification of diester carbonate, and it is also possible to use polycarbonate resin which is generally available commercially. As a commercially available product, it is possible to use Panlite Series manufactured by Teijin Limited. The composition for an optical material of the present embodiment can contain polycarbonate as a resin for an optical material.

Examples of poly(meth)acrylate include poly(meth)acrylate of alkane polyols such as ethylene glycol di(meth) acrylate, propylene glycol di(meth)acrylate, butylene glycol di(meth)acrylate, neopentyl glycol di(meth)acrylate, hexylene glycol di(meth)acrylate, trimethylolpropane tri(meth) acrylate, and pentaerythritol tetra(meth)acrylate; and polyoxyalkanepolyol poly(meth)acrylate such as diethylene glycol di(meth)acrylate, triethylene glycol di(meth)acrylate, polyethylene glycol di(meth)acrylate, dipropylene glycol di(meth)acrylate, polypropylene glycol di(meth)acrylate, dibutylene glycol di(meth)acrylate, and dipentaerythritol hexa(meth)acrylate.

The composition for an optical material of the present embodiment can contain poly(meth)acrylate as a resin for an optical material.

Polyolefin is produced by polymerizing at least one kind of olefin selected from α-olefins in the presence of a well-known catalyst for olefin polymerization such as a Ziegler-Natta catalyst, a metallocene catalyst, or a so-called post-metallocene catalyst. α-olefin monomer may be a single component, or a composite component may be copolymerized.

The polymerization reaction of olefin for producing polyolefin can be performed through a liquid phase polymerization method such as a solution polymerization method, a suspension polymerization method, or a bulk polymerization method; a gas phase polymerization method; or other well-known polymerization methods. When producing polyolefin, liquid phase polymerization methods such as dissolution polymerization and suspension polymerization (slurry polymerization) are preferably used and a suspension polymerization (slurry polymerization) method is more preferably used. Well-known conditions can be applied to the conditions of the temperature or the pressure for polymerization.

The composition for an optical material of the present embodiment can contain polyolefin as a resin for an optical material.

Cyclic polyolefin is produced by polymerizing at least one kind of cyclic olefin selected from cyclic olefins in the presence of a well-known olefin polymerization catalyst. The cyclic olefin monomer may be a single component or a composite component may be copolymerized. As cyclic polyolefin, APEL which is trademarked and is manufactured by Mitsui Chemicals, Inc. can be suitably used as it has high transparency.

Polyallyl is produced by polymerizing at least one kind of allyl group-containing monomer selected from allyl group-containing monomers in the presence of a well-known polymerization catalyst with properties of generating radicals. As the allyl group-containing monomers, it is possible to suitably use allyl diglycol carbonate or diallylphthalate which is generally available in the market.

Polyurethane urea is a reaction product caused by polyurethane prepolymer and a diamine hardener, and a representative example thereof is TRIVEX which is trademarked available from PPG Industries, Inc. Polyurethane polyurea is a material having high transparency and can be suitably used.

A polyene-polythiol polymer is a polymer product which is generated through addition polymerization and ethylene chain polymerization of a polyene compound having at least two ethylenic functional groups in one molecule and a polythiol compound having at least two thiol groups in one molecule.

Examples of the polyene compound in the polyene-polythiol polymer include an allyl alcohol derivative, esters of (meth)acrylic acid and polyhydric alcohol, urethane acrylate, and divinylbenzene. One kind or at least two kinds thereof can be used. Examples of the allyl alcohol derivative include triallyl isocyanurate, triallyl cyanurate, diallyl maleate, diallyl fumarate, diallyl adipate, diallyl phthalate, triallyl trimellitate, tetraallyl pyromellitate, glycerin diallyl ether, trimethylolpropane diallyl ether, pentaerythritol diallyl ether, and sorbitol diallyl ether. Examples of the polyhydric alcohol among esters of (meth)acrylic acid and polyhydric alcohol include ethylene glycol, propylene glycol, 1,4-butanediol, 1,6-hexanediol, glycerin, trimethylolpropane, pentaerythritol, and sorbitol.

The ring-opening metathesis polymer is a polymer which is obtained by subjecting cyclic olefins to ring-opening polymerization using a catalyst. There is no particular restriction in the cyclic olefins which can be subjected to ring-opening polymerization as long as the olefins have a cyclic structure, but in general, examples thereof include 3-40C monocyclic cycloalkenes, monocyclic cycloalkadienes, polycyclic cycloalkenes, and polycyclic cycloalkadienes. Specific examples of the monocyclic cycloalkenes include cyclobutene, cyclopentene, cyclohexene, and cyclooctene. Specific examples of the monocyclic cycloalkadienes include cyclobutadiene, 1,3-cyclopentadiene, 1,3-cyclohexadiene, 1,4-cyclohexadiene, and 1,5-cyclooctadiene. Examples of the polycyclic cycloalkenes include norbornene and tetracyclo[6.2.1.1$^{3,6}$.0$^{2,7}$]dodeca-4-ene. Examples of the polycyclic cycloalkadienes include norbornadiene and dicyclopentadiene. These may be substituted with oxygen, sulfur, halogen, or the like. Furthermore, these may be used by being hydrogenated. Suitable examples thereof include ARTON (trademark) of JSR Corporation.

Polyester is subjected to condensation polymerization in the presence of a well-known polyester-producing catalyst such as a Lewis acid catalyst such as an antimony compound and a germanium compound, or an organic acid and an inorganic acid. Specifically, polyester refers to polyester comprised of one kind or at least two kinds selected from polycarboxylic acid containing dicarboxylic acid and an ester-forming derivative thereof and one kind or at least two kinds selected from polyhydric alcohol containing glycol; polyester comprised of hydroxy carboxylic acid and an ester-forming derivative thereof; or polyester comprised of cyclic ester.

Examples of the dicarboxylic acid include saturated aliphatic dicarboxylic acid exemplified by oxalic acid, malonic acid, succinic acid, glutaric acid, adipic acid, pimelic acid, suberic acid, azelaic acid, sebacic acid, decane dicarboxylic acid, dodecane dicarboxylic acid, tetradecane dicarboxylic acid, hexadecane dicarboxylic acid, 1,3-cyclobutane dicarboxylic acid, 1,3-cyclopentane dicarboxylic acid, 1,2-cyclohexanedicarboxylic acid, 1,3-cyclohexanedicarboxylic acid, 1,4-cyclohexanedicarboxylic acid, 2,5-norbornane dicarboxylic acid, and dimer acid, or ester-forming derivatives thereof; unsaturated aliphatic dicarboxylic acid exemplified by fumaric acid, maleic acid, and itaconic acid, or ester-forming derivatives thereof; and aromatic dicarboxylic acid exemplified by orthophthalic acid, isophthalic acid, terephthalic acid, 5-(alkali metal)sulfoisophthalic acid, diphenic acid, 1,3-naphthalenedicarboxylic acid, 1,4-naphthalenedicarboxylic acid, 1,5-naphthalenedicarboxylic acid, 2,6-naphthalenedicarboxylic acid, 2,7-naphthalenedicarboxylic acid, 4,4'-biphenyl dicarboxylic acid, 4,4'-biphenyl sulfone dicarboxylic acid, 4,4'-biphenyl ether dicarboxylic acid, 1,2-bis(phenoxy)ethane-p,p'-dicarboxylic acid, pamoic acid, and anthracene dicarboxylic acid, or ester-forming derivatives thereof. Terephthalic acid and naphthalenedicarboxylic acid, in particular, 2,6-naphthalenedicarboxylic acid, are preferable among these dicarboxylic acids in terms of physical properties of polyester to be obtained, and another dicarboxylic acid may be set as a constituent component as necessary. Examples of polycarboxylic acid other than these dicarboxylic acids include ethane tricarboxylic acid, propane tricarboxylic acid, butane tetracarboxylic acid, pyromellitic acid, trimellitic acid, trimesic acid, and 3,4,3',4'-biphenyltetracarboxylic acid or ester-forming derivatives thereof.

Examples of glycol include aliphatic glycols exemplified by ethylene glycol, 1,2-propylene glycol, 1,3-propylene glycol, diethylene glycol, triethylene glycol, 1,2-butylene glycol, 1,3-butylene glycol, 2,3-butylene glycol, 1,4-butylene glycol, 1,5-pentanediol, neopentyl glycol, 1,6-hexanediol, 1,2-cyclohexanediol, 1,3-cyclohexanediol, 1,4-cyclohexanediol, 1,2-cyclohexane dimethanol, 1,3-cyclohexane dimethanol, 1,4-cyclohexane dimethanol, 1,4-cyclohexane diethanol, 1,10-decamethylene glycol, 1,12-dodecane diol, polyethylene glycol, polytrimethylene glycol, and polytetramethylene glycol; and aromatic glycols exemplified by hydroquinone, 4,4'-dihydroxy bisphenol, 1,4-bis(β-hydroxyethoxy)benzene, 1,4-bis(β-hydroxyethoxy phenyl)sulfone, bis(p-hydroxyphenyl)ether, bis(p-hydroxyphenyl)sulfone, bis(p-hydroxyphenyl)methane, 1,2-bis(p-hydroxyphenyl)ethane, bisphenol A, bisphenol C, 2,5-naphthalene diol, and glycols obtained by adding ethylene oxide to these glycols.

Among these glycols, ethylene glycol, 1,3-propylene glycol, 1,4-butylene glycol, and 1,4-cyclohexane dimethanol are preferable. Examples of the polyhydric alcohol other than these glycols include trimethylol methane, trimethylol ethane, trimethylol propane, pentaerythritol, glycerol, and hexanetriol.

As polyester, polyethylene terephthalate, polybutylene terephthalate, polypropylene terephthalate, poly(1,4-cyclohexane dimethylene terephthalate), polyethylene naphthalate, polybutylene naphthalate, and polypropylene naphthalate, and copolymers thereof are preferable.

The epoxy resin is a resin which is obtained by subjecting an epoxy compound to ring-opening polymerization, and examples of the epoxy compound include phenolic epoxy compounds which are obtained through condensation reaction between an epihalohydrin compound and a polyhydric phenol compound such as bisphenol A glycidyl ether, or bisphenol F glycidyl ether; alcohol-based epoxy compounds which are obtained through condensation between an epihalohydrin compound and a polyhydric alcohol compound such as hydrogenated bisphenol A glycidyl ether, hydrogenated bisphenol F glycidyl ether, or cyclohexane dimethanol; glycidyl ester-based epoxy compounds which are obtained through condensation between an epihalohydrin compound and a polyvalent organic acid compound such as 3,4-epoxycyclohexylmethyl-3',4'-epoxycyclohexane carboxylate or 1,2-hexahydrophthalic acid diglycidyl ester; and amine-based epoxy compounds which are obtained through condensation between an epihalohydrin compound and primary and secondary amine compounds. In addition, other examples thereof include aliphatic polyvalent epoxy compounds such as vinylcyclohexene diepoxide such as 4-vinyl-1-cyclohexane diepoxide.

In the present embodiment, the composition for an optical material can be obtained by mixing the above-described components through a predetermined method.

The order or the method for mixing components in the composition is not particularly limited as long as it is possible to evenly mix the components with each other, and can be performed through a well-known method. Examples of the well-known method include a method for preparing a masterbatch containing a predetermined amount of an additive and dispersing and dissolving this masterbatch in a solvent. For example, in a case of polyurethane resin, there is a process for producing a masterbatch by dispersing and dissolving an additive in a polyisocyanate compound.

A molded product containing organic dyes can be obtained through a method for polymerizing the composition for an optical material which is obtained by mixing organic dyes with a resin monomer for an optical material, or a method for curing the composition for an optical material containing organic dyes and a resin for an optical material.

[Molded Product]

Hereinafter, a molded product of the present embodiment will be described.

The molded product of the present embodiment is obtained by molding the composition for an optical material of the present embodiment. The molded product contains organic dyes and a resin for an optical material and can be used as an optical material.

Examples of the optical material include various plastic lenses such as plastic spectacle lenses, goggles, vision correction spectacle lenses, lenses for imaging equipment, Fresnel lenses for liquid crystal projectors, lenticular lenses, and contact lenses; a sealing material for a light-emitting diode (LED); an optical waveguide; an optical adhesive used for optical lenses or optical waveguides; an antireflection film used for optical lenses; a transparent coating which is used for members (a substrate, a light-guiding plate, a film, or a sheet) for liquid crystal display; a film which is attached to a windscreen of a vehicle or a windshield of a helmet of a motorbike, a transparent substrate; or a cover of a illuminating device or an irradiation surface of a illuminating device. The molded product can be obtained from the composition for an optical material of the present embodiment. The optical material of the present embodiment can contain an ultraviolet absorber. Plastic spectacle lenses are preferable as the optical materials.

Next, an optical material of the present embodiment and use thereof will be described.

[Optical Material]

In the optical material of the present embodiment, it is possible to maintain a normal circadian rhythm by suppressing the inhibition of melatonin secretion due to light exposure at night, by selectively absorbing light in a wavelength range of 445 nm to 470 nm.

When a body is exposed to light in the morning, the body enters an active state due to the biological clock which has been reset. This is because secretion of melatonin stops due to a signal from the biological clock. Melatonin is secreted again in response from a command from the biological clock after the lapse of about 14 hours to 16 hours after waking up.

The deep body temperature is decreased due to an action of a gradual increase of secretion of melatonin, a person enters a state which is suitable for resting, and the person becomes sleepy. In this manner, the secretion of melatonin is mainly adjusted by light, the amount of melatonin secreted decreases when the person is under strong illumination at night, and the time for resting is not transmitted to the biological clock, which becomes a cause to disturb a sleep-awakening rhythm.

According to the method of the present embodiment, a normal circadian rhythm is maintained by suppressing the inhibition of melatonin secretion due to light exposure at night, by selectively absorbing light centered at 460 nm.

Particularly, in the optical material of the present embodiment, it is possible to selectively absorb light in a wavelength range of 445 nm to 470 nm and to improve the rate of blocking light in a region around 430 nm to 490 nm at the same time, by satisfying the specified requirements for a transmittance curve, which is preferable from the viewpoint of the above effect.

Representative examples of the configuration of the optical material of the present embodiment include an optical material composed of a lens base material; an optical material composed of a lens base material and a film layer; an optical material composed of a lens base material and a coating layer; and an optical material composed of a lens base material, a film layer, and a coating layer.

Specific examples of the optical material of the present embodiment include an optical material comprised of a lens base material; an optical material which is obtained by stacking film layers over at least one surface of a lens base material; an optical material which is obtained by stacking a film layer and a coating layer over at least one surface of a lens base material; and an optical material which is obtained by interposing a film layer between two lens base materials.

The optical material of the present embodiment has a minimum transmittance value in a wavelength range of 445 nm to 470 nm in a transmittance curve measured at a thickness of 2 mm of the optical material, and preferably has the above-described characteristics of (1) to (4), as the whole optical material.

The amount of organic dye contained in an optical material is not particularly limited as long as the amount of organic dye is within the range satisfying the above-described characteristics of a transmittance curve. However, in a case of using at least one kind of porphine-based compounds, the organic dye can be contained at amounts of 5 ppm to 100 ppm and preferably 5 ppm to 50 ppm from the viewpoint of the above-described effect.

For example, a molded product (a lens base material or an optical film) is prepared using a composition for an optical material containing no organic dyes. Next, organic dyes are dispersed in water or a solvent, the molded product is immersed in the obtained dispersion liquid, and the molded product is impregnated with the organic dyes and is dried. It is possible to prepare an optical material using the molded product which has been obtained in this manner.

In addition, it is possible to impregnate the optical material with the porphyrin-based compound represented by General Formula (A) after the optical material is prepared.

In addition, it is possible to immerse a plastic spectacle lens, which includes a lens base material, and a film layer and a coating layer which are stacked as necessary, in a dispersion liquid containing organic dyes, and to impregnate the plastic spectacle lens with the organic dyes.

The amount of organic dye impregnated can be controlled to be a desired impregnation amount using the concentration of organic dye in a dispersion liquid, the temperature of a dispersion liquid, and a time period for which a resin composition for an optical material is immersed. The impregnation amount is further increased as the concentration of organic dye is made to be higher, the temperature of a dispersion liquid is made to be higher, and the immersion time is made to be longer. In a case where it is necessary to precisely control the impregnation amount, the control thereof is carried out by repeating the immersion plural times under the condition of a small impregnation amount.

In addition, it is also possible to form an organic dye-containing coating layer over an optical material such as a plastic lens, using an organic dye-containing coating material (composition for an optical material).

The optical material having such a configuration can be suitably used as a plastic spectacle lens.

The present embodiment is not limited to the above-described embodiment and various modes can be taken within a range in which the effect of the present invention is not impaired.

For example, when an optical material can satisfy the above-described characteristics of (1) to (4), it is possible to obtain the optical material without using the "composition for an optical material containing a porphyrin-based compound represented by General Formula (A)" of the above-described embodiment. It is possible to use the "composition for an optical material" of the above-described embodiment except that the composition for an optical material does not contain the porphyrin-based compound represented by General Formula (A) and it is possible to employ the same configuration in that case.

Hereinafter, the plastic lens which is a preferred mode of an optical material will be described in detail.

[Plastic Lens]

Examples of a plastic lens include the following configuration.

(A) Plastic lens including lens base material comprised of composition for optical material of present embodiment
(B) Plastic lens including film or coating layer comprised of composition for optical material of present embodiment, over at least one surface of lens base material (but, excluding lens base material obtained from composition for optical material of present embodiment)
(C) Plastic lens in which lens base materials (but, excluding lens base materials obtained from composition for optical material of present embodiment) are stacked over both surfaces of film comprised of composition for optical material of present embodiment In the present embodiment, it is possible to use these plastic lenses suitably.

Hereinafter, each of the embodiments will be described.

Embodiment: A

A process for producing a plastic lens including a lens base material comprised of a composition for an optical material of the present embodiment is not particularly limited, but preferred examples of the production method include cast polymerization using a lens casting mold. The lens base material can be comprised of polyurethane, polythiourethane, polysulfide, poly(meth)acrylate, and the like, and it is possible to use organic dyes and a composition for an optical material of the present embodiment containing monomers (resin monomer for an optical material) of these resins.

Specifically, a composition for an optical material is injected into a cavity of a mold which is held by a gasket, tape, or the like. At this time, in many cases, it is preferable to perform a degassing treatment under reduced pressure, a filtration treatment of pressures or reduced pressure, or the like as necessary in accordance with the properties required for a plastic lens to be obtained.

After injecting the composition into the cavity thereof, the lens casting mold is heated in an oven, or in a heatable device in water or the like using a predetermined temperature program, and the heated lens casting mold is cured and molded. A resin molded product may be subjected to a treatment such as annealing as necessary.

In the present embodiment, when molding a resin, various additives such as a chain extender, a cross-linking agent, a light stabilizer, an antioxidant, an oil-soluble dye, a filler, and an adhesion-improving agent may be added, similarly to a well-known molding method depending on the purpose, in addition to the above-described "arbitrary additive".

In addition, the plastic lens in the present embodiment may have various coating layers over a lens base material comprised of the composition for an optical material of the present embodiment in accordance with the purpose or use thereof. The coating layers may contain organic dyes. The coating layers containing organic dyes can be prepared using a coating material (composition) containing organic dyes. Alternately, the coating layers containing organic dyes can be prepared by immersing a plastic lens, to which coating layers are attached, in a dispersion liquid which is obtained by dispersing organic dyes in water or a solvent and impregnating the coating layers with the organic dyes, after the coating layers are formed.

Embodiment: B

A plastic lens in the present embodiment includes a layer or a film comprised of a composition for an optical material of the present embodiment over at least one surface of a lens base material. The lens base material is not comprised of the composition for an optical material of the present embodiment.

Examples of the process for producing the plastic lens in the present embodiment include (B-1) a process for producing a lens base material, and subsequently stacking a film or a sheet comprised of the composition for an optical material of the present embodiment over at least one surface of the lens base material; and (B-2) a method for placing a film or a sheet comprised of the composition for an optical material of the present embodiment along one inner wall of a mold which is held by a gasket, tape, or the like, which will be described later, in a cavity of the mold, and subsequently injecting the composition for an optical material into the cavity, and curing the composition.

The film or the sheet comprised of the composition for an optical material of the present embodiment which is used in the method of (B-1) is not particularly limited. However, pellets of the composition for an optical material obtained through melting and kneading, impregnating, or the like can be obtained through various well-known methods in the related art. Specific examples of the methods include molding methods such as an injection molding method, a profile extrusion molding method, a pipe molding method, a tube molding method, a coating molding method of dissimilar molded bodies, an injection blow molding method, a direct blow molding method, a T-die sheet or film molding method, an inflation film molding method, and a press molding method. The obtained film or sheet contains polycarbonate, polyolefin, or the like.

The lens base material can be obtained from a well-known optical resin, and examples of the optical resin include poly(thio)urethane and polysulfide.

A well-known method can be used as the method for stacking the film or the sheet comprised of the composition for an optical material of the present embodiment over the surface of the lens base material.

Cast polymerization in the method of (B-2) can be performed similarly to the process for producing the plastic lens in Embodiment: A, and examples of a composition used for cast polymerization include a composition containing a resin monomer for an optical material (which contain no organic dye).

In addition, the plastic lens in the present embodiment may have various coating layers over a lens base material or a "film or a layer" comprised of the composition for an optical material in accordance with the purpose or use thereof. Similarly to the plastic lens in Embodiment: A, it is possible to make the coating layers contain organic dyes.

Embodiment; C

In a plastic lens in the present embodiment, lens base materials (excluding lens base materials which are obtained from a composition for an optical material of the present embodiment) are stacked over both surfaces of a film comprised of the composition for an optical material of the present embodiment.

Examples of the process for producing the plastic lens in the present embodiment include (C-1) a process for producing lens base materials, and subsequently stacking the produced lens base materials over both surfaces of a film or a sheet comprised of the composition for an optical material of the present embodiment; and (C-2) a method for placing a film or a sheet comprised of the composition for an optical material of the present embodiment in a cavity of a mold which is held by a gasket, tape, or the like, in a state of being separated from the inner wall of the mold, and subsequently injecting the composition for an optical material into the cavity, and curing the composition.

As the film or the sheet comprised of the composition for an optical material of the present embodiment, and the lens base materials which are used in the method of (C-1), the same film or sheet and the same lens base materials as those in the method of (B-1) of the plastic lens in Embodiment: B can be used.

A well-known method can be used as the method for stacking the film or the sheet comprised of the composition for an optical material of the present embodiment over the surfaces of the lens base materials.

Specifically, the method of (C-2) can be performed as follows.

The film or the sheet comprised of the composition for an optical material of the present embodiment which is used for the process for producing a plastic lens in Embodiment: A is placed in a space of a lens casting mold such that the both surfaces of the film or the sheet thereof become parallel to the inner surface of the mold on an opposing front side.

Next, a composition containing a resin monomer for an optical material (which does not contain organic dyes) is injected into two spaces between the mold and a polarization film using predetermined injection means, in the space of the lens casting mold.

After injecting the composition into the gap portions, the lens casting mold is heated in an oven, or in a heatable device in water or the like using a predetermined temperature program, and the heated lens casting mold is cured and molded. A resin molded product may be subjected to a treatment such as annealing as necessary.

In addition, the plastic lens in the present embodiment may have various coating layers over a lens base material in accordance with the purpose or use thereof. Similarly to the plastic lens in Embodiment: A, it is possible to make the coating layers contain organic dyes.

[Plastic Spectacle Lens]

A plastic spectacle lens can be obtained using the plastic lens of the present embodiment. A coating layer may be applied to a single surface or both surfaces of the plastic lens as necessary.

Specific examples of the coating layer include a primer layer, a hard coat layer, an anti-reflection layer, an anti-fog coating layer, an anti-contamination layer, and a water-repellent layer. These coating layers can be used singly or a plurality of coating layers can be used by being multilayered. In a case of applying coating layers to both surfaces of a plastic lens, the same or different kinds of the coating layers may be applied to the surfaces.

These coating layers may be used together with organic dyes used in the present embodiment; an infrared ray absorbent for the purpose of protecting the eyes from an infrared ray; a light stabilizer or an antioxidant for the purpose of improving weather resistance of a lens; dyes or pigments and photochromic colors or pigments for the purpose of enhancing fashionability of a lens; an antistatic agent; and well-known additives in order to increase the performance of a lens. In regard to layers on which coating is performed through application, various leveling agents for the purpose of improving application properties may be used.

In general, a primer layer is formed between a lens and a hard coat layer to be described below. The primer layer is a coating layer which is intended to improve adhesion between the lens and the hard coat layer which is formed over the primer layer, and it is possible to improve the shock resistance depending on the case. As the primer layer, any material can be used as long as the material has high adhesion with respect to the obtained lens, but in general, an urethane-based resin, an epoxy-based resin, a polyester resin, a melamine-based resin, a primer composition having polyvinyl acetal as a main component, or the like can be used. As the primer composition, a suitable solvent which does not affect a lens may be used for the purpose of adjusting the viscosity of the composition. As a matter of course, the primer composition may be used without any solvent.

The primer layer can be formed through either method of an application method or a dry method. In a case of using the application method, a primer layer is formed by solidifying a primer composition after applying the primer composition to a lens through a well-known application method such as spin coating and dip coating. In a case of performing the dry method, a primer layer is formed through a well-known dry method such as a CVD method or a vacuum evaporation method. When forming a primer layer, the surface of a lens may be subjected to a pretreatment such as an alkaline treatment, a plasma treatment, and an ultraviolet treatment as necessary for the purpose of improving adhesion.

The hard coat layer is a coating layer which is intended to provide the surface of a lens with functions such as scratch resistance, abrasion resistance, moisture resistance, hot water resistance, heat resistance, or weather resistance.

The hard coat layer is generally composed of the composition containing an organic silicon compound having curability, and at least one kind of oxide fine particles of elements selected from an element group consisting of Si, Al, Sn, Sb, Ta, Ce, La, Fe, Zn, W, Zr, In, and Ti and/or at least one kind of fine particles comprised of a composite oxide of at least two kinds of elements selected from the element group.

It is preferable that the hard coat composition contains at least either of amines, amino acids, metal acetylacetonate complexes, organic acid metal salts, perchloric acids, salts of perchloric acids, acids, metal chlorides, and polyfunctional epoxy compounds, in addition to the above-described components. As the hard coat composition, a suitable solvent which does not affect a lens may be used, or the hard coat composition may be used without any solvent.

The hard coat layer is formed by being cured after applying a hard coat composition to the hard coat layer through a well-known application method such as spin coating and dip coating. Examples of the curing method include a heat curing method, a curing method performed through energy ray irradiation such as ultraviolet rays and visible rays, and the like. In order to suppress generation of interference fringes, the difference between the refractive index of the hard coat layer and the refractive index of the lens is preferably within a range of ±0.1.

In general, an anti-reflection layer is formed over the hard coat layer as necessary. The anti-reflection layer contains an inorganic anti-reflection layer and an organic anti-reflection layer. In a case of the inorganic anti-reflection layer, an anti-reflection layer is formed through a dry method such as a vacuum evaporation method, a sputtering method, an ion plating method, an ion beam-assisting method, and a CVD method using an inorganic oxide such as $SiO_2$ and $TiO_2$. In a case of the organic anti-reflection layer, an anti-reflection layer is formed through a wet method using a composition containing an organic silicon compound and silica-based fine particles having an internal cavity.

The anti-reflection layer contains an anti-reflection monolayer and an anti-reflection multilayer. In a case where the anti-reflection layer is used as the monolayer, it is preferable that the refractive index of the monolayer becomes smaller than the refractive index of the hard coat layer by at least 0.1 or more. In order to effectively exhibit the anti-reflection function, an anti-reflection multilayer film is preferable. In this case, low refractive index films and high refractive index films are alternately stacked. Even in this case, it is preferable that the difference in the refractive index between a low refractive index film and a high refractive index film is 0.1 or more. Examples of the high refractive index film include a ZnO film, a $TiO_2$ film, a $CeO_2$ film, a $Sb_2O_5$ film, a $SnO_2$ film, a $ZrO_2$ film, and a $Ta_2O_5$ film. Examples of the low refractive index film include a $SiO_2$ film or the like.

An anti-fog layer, an anti-contamination layer, and a water-repellent layer may be formed over the anti-reflection layer as necessary. The treatment method, the treatment material, and the like of the method for forming the anti-fog layer, the anti-contamination layer, and the water-repellent layer are not particularly limited as long as these do not adversely affect the anti-reflection function, and it is possible to use an anti-fog treatment method, an anti-contamination treatment method, a water-repellent treatment method, and a material which are well known. Examples of the anti-fog treatment method and the anti-contamination treatment method include a method for covering the surface of an anti-reflection layer with a surfactant; a method for making the surface thereof have water absorbing properties by providing a hydrophilic film; a method for improving water absorbing properties by covering the surface thereof with fine recesses and projections; a method for making the surface thereof have water absorbing properties using an photocatalytic activity; and a method for preventing adhesion of water droplets by subjecting the surface thereof to a super water-repellent treatment. In addition, examples of the water-repellent treatment method include a method for forming a water-repellent treatment layer through evaporating or sputtering of a fluorine-containing silane compound; or a method for forming a water-repellent treatment layer by dissolving a fluorine-containing silane compound in a solvent and subsequently coating the surface thereof with the dissolved fluorine-containing silane compound.

EXAMPLES

Hereinafter, the present invention will be described in detail using Examples, but is not limited thereto. The material and the evaluation method used in Examples of the present invention are as follows.

[Measurement Method of Transmittance Curve]

A Shimadzu spectrophotometer UV-1600 manufactured by Shimadzu Corporation was used as a measurement device, and a transmittance curve was measured using a plano lens with a thickness of 2 mm.

Synthesis Example 1

15.0 g of a compound represented by the following Structural Formula (2-a) was dissolved in 150 ml of N,N-dimethylformamide, and 31.8 g of bromine was added dropwise thereto at 10° C. to 20° C. After stirring the mixture for 4 hours at room temperature, the stirred mixture was discharged to 700 g of ice water and was neutralized with a sodium hydroxide aqueous solution. Precipitates were filtered out, washed with water, washed with methanol, and dried to obtain 31 g of a compound represented by the following Structural Formula (2-b). A Shimadzu spectrophotometer UV-1600 manufactured by Shimadzu Corporation was used to measure an absorption spectrum of this compound of (2-b) at an optical path length of 10 mm of a chloroform solution thereof at a concentration of 0.01 g/L, and as a result, there was an absorption peak at 450 nm. In addition, the half-value width of the peak was 24 nm. The absorption spectrum is shown in FIG. 1.

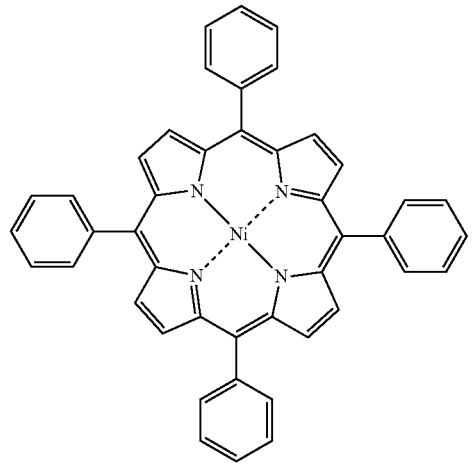

(2-a)

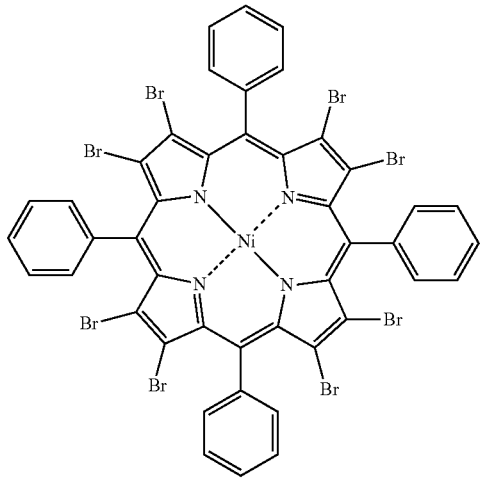

(2-b)

Synthesis Example 2

17.0 g of a compound represented by the following Structural Formula (3-a) was dissolved in 170 ml of N,N-dimethylformamide, and 35.8 g of bromine was added dropwise thereto at 10° C. to 20° C. After stirring the mixture for 4 hours at room temperature, the stirred mixture was discharged to 800 g of ice water and was neutralized with a sodium hydroxide aqueous solution. Precipitates were filtered out, washed with water, washed with methanol, and dried to obtain 32 g of a compound represented by the following Structural Formula (3-b). A Shimadzu spectrophotometer UV-1600 manufactured by Shimadzu Corporation was used to measure an absorption spectrum of this compound of (3-b) at an optical path length of 10 mm of a chloroform solution thereof at a concentration of 0.01 g/L, and as a result, there was an absorption peak at 463 nm. In addition, the half-value width of the peak was 28 nm. The absorption spectrum is shown in FIG. 1.

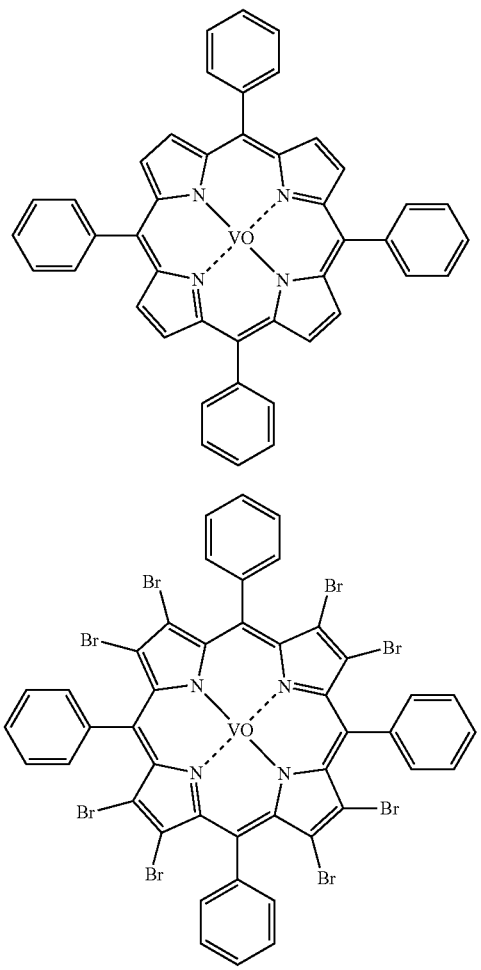

(3-a)

(3-b)

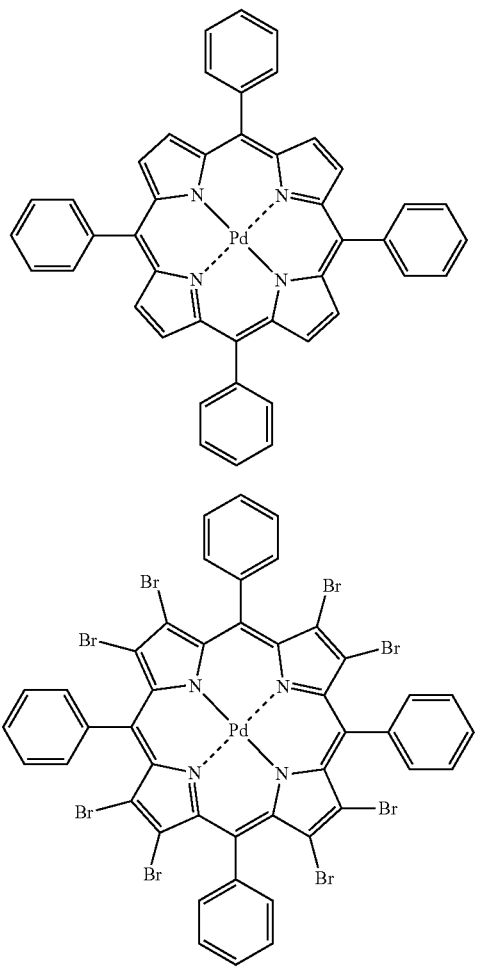

(4-a)

(4-b)

Synthesis Example 3

30.0 g of a compound represented by the following Structural Formula (4-a) was dispersed in 150 g of 1,1,2-trichloroethane and 60 g of water, and a solution containing 58.7 g of bromine and 60 g of 1,1,2-trichloroethane was added dropwise thereto at 50° C. to 55° C. After stirring the reaction solution for 3 hours at 50° C. to 55° C., the reaction solution was cooled to room temperature. A sodium sulfite aqueous solution (4.2 g of sodium sulfite and 21 g of water) was added to the reaction solution and the reaction solution was stirred for 15 minutes at room temperature. Next, a sodium hydroxide aqueous solution (16.2 g of sodium hydroxide and 162 g of water) was added to the reaction solution which was then stirred for 30 minutes at room temperature. Precipitates were filtered out, washed with water, washed with methanol, and dried to obtain 45.6 g of a compound represented by the following Structural Formula (4-b). A Shimadzu spectrophotometer UV-1600 manufactured by Shimadzu Corporation was used to measure an absorption spectrum of this compound of (4-b) at an optical path length of 10 mm of a chloroform solution thereof at a concentration of 0.01 g/L, and as a result, there was an absorption peak at 449.5 nm. In addition, the half-value width of the peak was 28 nm.

A Shimadzu spectrophotometer UV-1600 manufactured by Shimadzu Corporation was used to measure an absorption spectrum of a mixture ((2-b)/(3-b):1/1) of the compound of (2-b) obtained in Synthesis Example 1 and the compound of (3-b) obtained in Synthesis Example 2 at an optical path length of 10 mm of a chloroform solution thereof at a concentration of 0.01 g/L, and as a result, there was an absorption peak at 460 nm. In addition, the half-value width of the peak was 34 nm. The absorption spectrum is shown in FIG. 1.

Example 1

0.060 g of dibutyltin (II) dichloride, 0.017 g of Zelec UN manufactured by Stepan Company, 0.255 g of 2-(2H-benzotriazole-2-yl)-4-tert-octylphenol, and 6.47 g of 2,5(6)-bis(isocyanatomethyl)-bicyclo[2.2.1]heptane were put into a flask which had been sufficiently dried, to prepare a mixed solution.

Next, each of 0.010 g of the porphyrin-based compound described in Formula (2-b) and 0.010 g of the porphyrin-based compound described in Formula (3-b) was dissolved in 100.0 g of 2,5(6)-bis(isocyanatomethyl)-bicyclo[2.2.1]heptane to prepare a masterbatch (1) in which the compound of Formula (2-b) was dissolved and a masterbatch (2) in which the compound of Formula (3-b) was dissolved.

0.85 g of the masterbatch (1) and 1.28 g of the masterbatch (2) were charged into the above-described mixed solution. This mixed solution was stirred for 1 hour at 25° C. and the masterbatches were completely dissolved. Then, 4.06 g of pentaerythritol tetrakis(3-mercaptopropionate) and 4.35 g of 1,2-bis[(2-mercaptoethyl)thio]-3-mercaptopropane were put into this preparation solution. The mixture was stirred for 30 minutes at 25° C. to make a homogeneous solution.

Defoaming was performed on this solution for 1 hour at 600 Pa and the solution was filtered through a 1 μm PTFE filter. Then, the filtered solution was injected into a 2C plano glass mold with a central thickness of 2 mm and a diameter of 80 mm.

Figure 2:
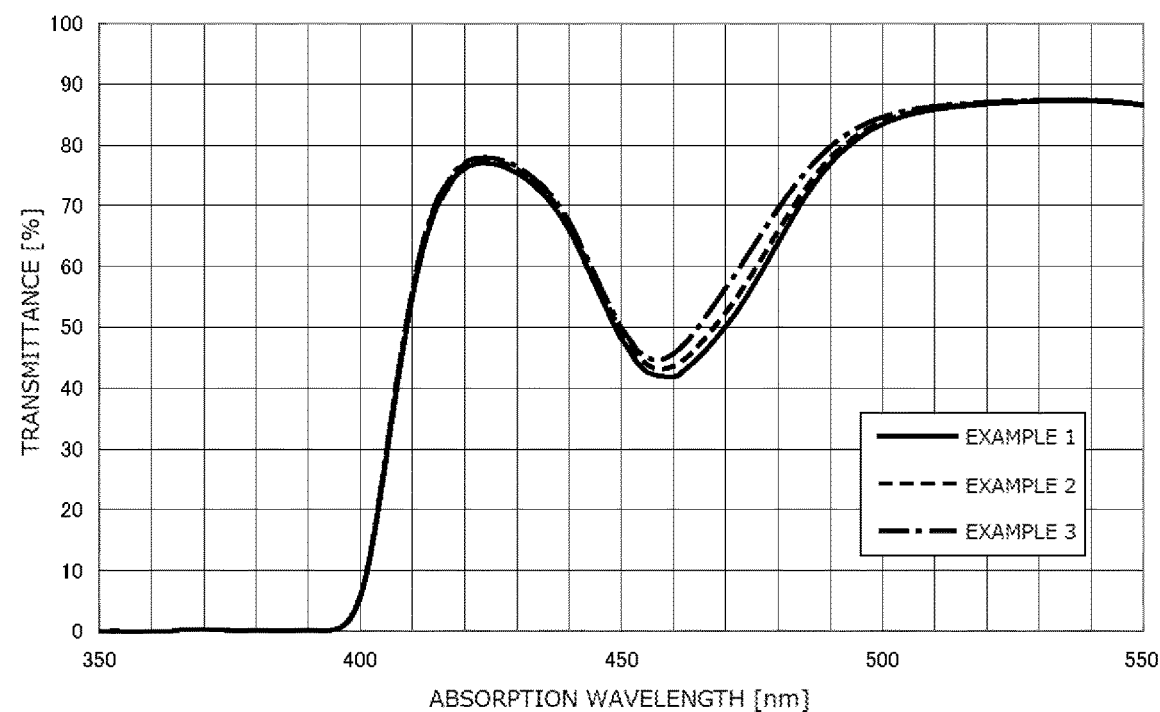
FIG. 2 shows transmittance curves of optical materials (plano lenses), with a thickness of 2 mm, which have been measured in Examples 1 to 3.

The temperature of this glass mold was increased over 16 hours from 25° C. to 120° C. The temperature of the glass mold was cooled to room temperature to obtain a plano lens which was taken out of the glass mold. The obtained plano lens was further subjected to annealing for 2 hours at 120° C. The measurement result of a transmittance curve is shown in FIG. 2.

Example 2

A plano lens was obtained through the same method as that in Example 1 except that the amount of 2,5(6)-bis(isocyanatomethyl)-bicyclo[2.2.1]heptane was changed to 6.69 g, the amount of the masterbatch (1) was maintained at 0.85 g without any change, and the charging amount of the masterbatch (2) was changed to 1.06 g when producing the homogeneous solution. The measurement result of a transmittance curve is shown in FIG. 2.

Example 3

A plano lens was obtained through the same method as that in Example 1 except that the amount of 2,5(6)-bis(isocyanatomethyl)-bicyclo[2.2.1]heptane was changed to 6.90 g, the amount of the masterbatch (1) was maintained at 0.85 g without any change, and the charging amount of the masterbatch (2) was changed to 0.85 g when producing the homogeneous solution. The measurement result of a transmittance curve is shown in FIG. 2.

Example 4

Figure 3:
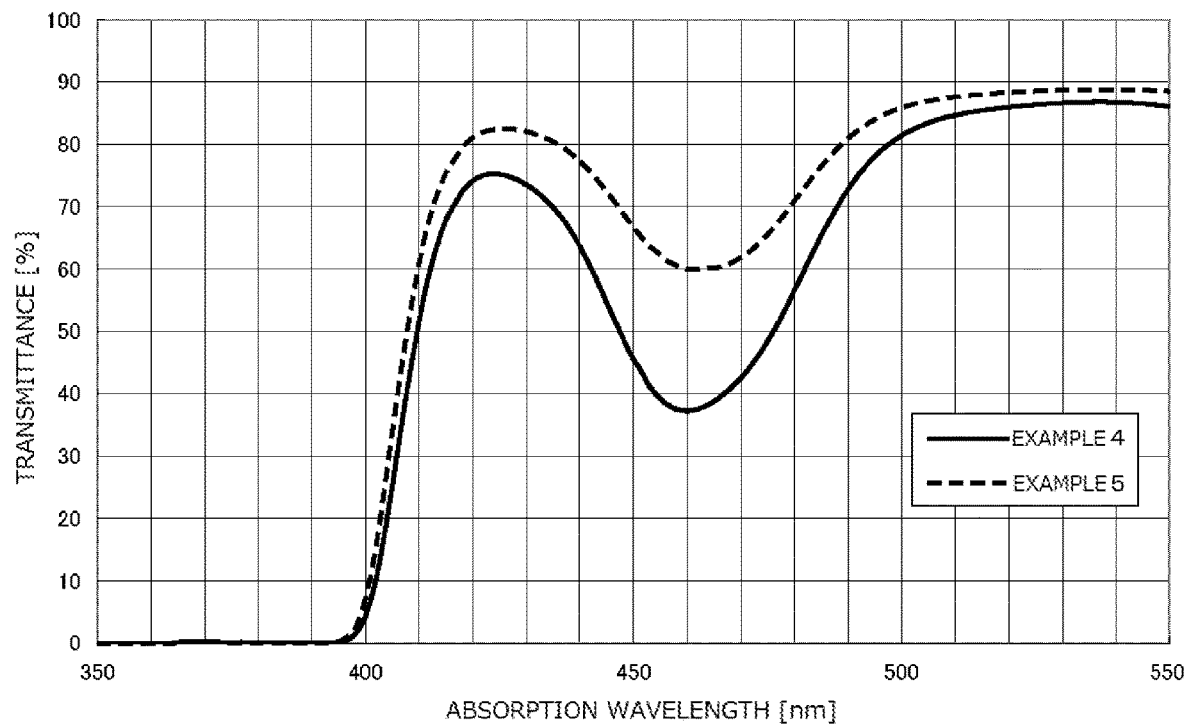
FIG. 3 shows transmittance curves of optical materials (plano lenses), with a thickness of 2 mm, which have been measured in Examples 4 and 5.

A plano lens was obtained through the same method as that in Example 1 except that the amount of 2,5(6)-bis(isocyanatomethyl)-bicyclo[2.2.1]heptane was changed to 5.77 g, the charging amount of the masterbatch (1) was changed to 1.13 g, and the amount of the masterbatch (2) charged into a mixed solution was changed to 1.70 g when producing the homogeneous solution. The measurement result of a transmittance curve is shown in FIG. 3.

Example 5

A plano lens was obtained through the same method as that in Example 1 except that the amount of 2,5(6)-bis(isocyanatomethyl)-bicyclo[2.2.1]heptane was changed to 7.54 g, the amount of the masterbatch (1) charged into a mixed solution was changed to 0.42 g, and the amount of the masterbatch (2) charged into the mixed solution was changed to 0.64 g when producing the homogeneous solution. The measurement result of a transmittance curve is shown in FIG. 3.

Example 6

Figure 4:
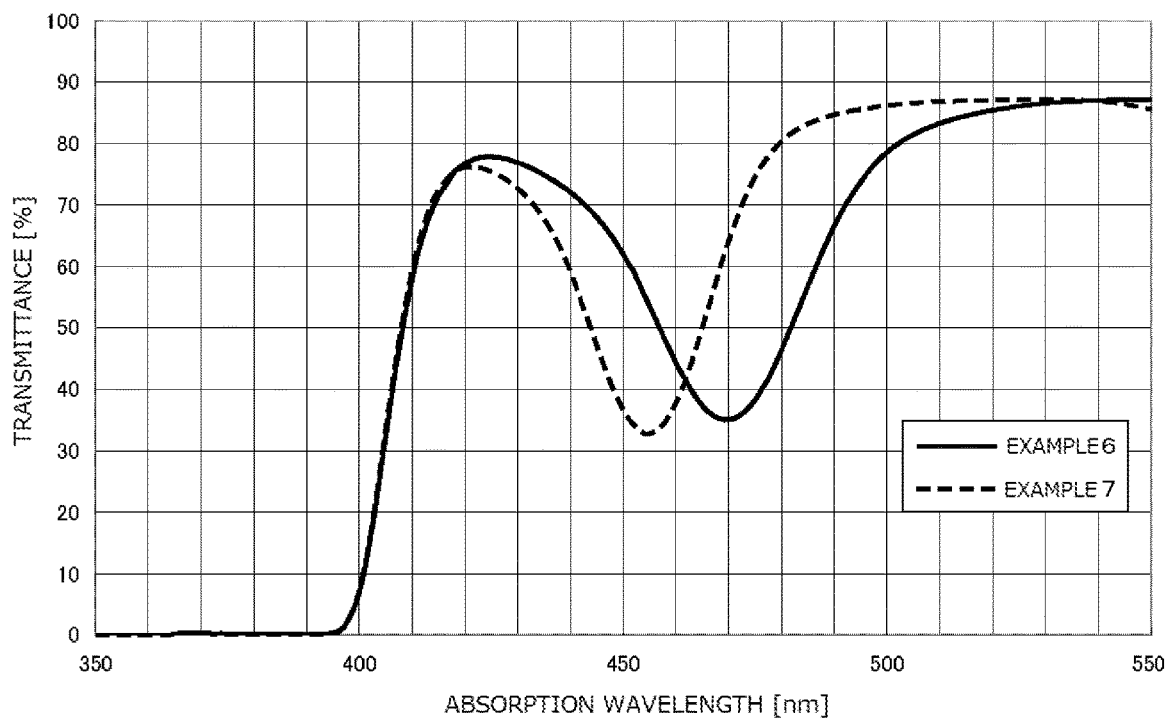
FIG. 4 shows transmittance curves of optical materials (plano lenses), with a thickness of 2 mm, which have been measured in Examples 6 and 7.

A plano lens was obtained through the same method as that in Example 1 except that the amount of 2,5(6)-bis(isocyanatomethyl)-bicyclo[2.2.1]heptane was changed to 6.56 g and the amount of the masterbatch (2) charged into a mixed solution was changed to 2.04 g without putting the masterbatch (1) thereinto when producing the homogeneous solution. The measurement result of a transmittance curve is shown in FIG. 4.

Example 7

A plano lens was obtained through the same method as that in Example 1 except that the amount of 2,5(6)-bis(isocyanatomethyl)-bicyclo[2.2.1]heptane was changed to 6.56 g and the amount of the masterbatch (1) charged into a mixed solution was changed to 2.04 g without putting the masterbatch (2) thereinto when producing the homogeneous solution. The measurement result of a transmittance curve is shown in FIG. 4.

Example 8

Figure 5:
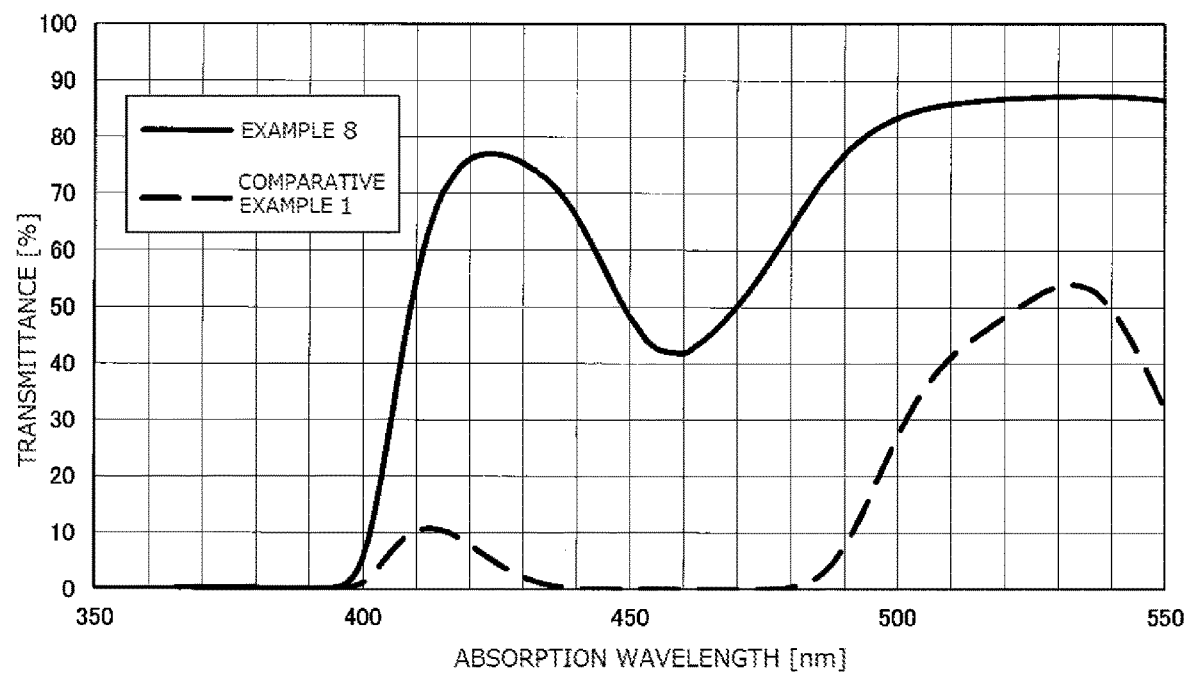
FIG. 5 shows transmittance curves of optical materials (plano lenses), with a thickness of 2 mm, which have been measured in Example 8 and Comparative Example 1.

A plano lens was obtained through the same method as that in Example 1 except that 0.010 g of the porphyrin-based compound described in Formula (4-b) was dissolved in 100.0 g of 2,5(6)-bis(isocyanatomethyl)-bicyclo[2.2.1]heptane to prepare a masterbatch (3) and 1.28 g of the masterbatch (3) was charged into a mixed solution without putting the masterbatch (2) thereinto. The measurement result of a transmittance curve is shown in FIG. 5.

Comparative Example 1

0.060 g of dibutyltin (II) dichloride, 0.017 g of Zelec UN manufactured by Stepan Company, 0.255 g of 2-(2H-benzotriazole-2-yl)-4-tert-octylphenol, 0.0022 g of the porphyrin-based compound described in Formula (2-b), 0.0022 g of the porphyrin-based compound described in Formula (3-b), and 8.6 g of 2,5(6)-bis(isocyanatomethyl)-bicyclo[2.2.1]heptane were put into a flask which had been sufficiently dried, to prepare a mixed solution. Then, 4.06 g of pentaerythritol tetrakis(3-mercaptopropionate) and 4.35 g of 1,2-bis[(2-mercaptoethyl)thio]-3-mercaptopropane were put into this preparation solution. The mixture was stirred for 30 minutes at 25° C. to make a homogeneous solution.

Defoaming was performed on this solution for 1 hour at 600 Pa and the solution was filtered through a 1 μm PTFE filter. Then, the filtered solution was injected into a 2C plano glass mold with a central thickness of 2 mm and a diameter of 80 mm.

The temperature of this glass mold was increased over 16 hours from 25° C. to 120° C. The temperature of the glass mold was cooled to room temperature to obtain a plano lens which was taken out of the glass mold. The obtained plano lens was further subjected to annealing for 2 hours at 120° C. The measurement result of a transmittance curve is shown in FIG. 5.

Priority is claimed on Japanese Patent Application No. 2013-187736, filed Sep. 10, 2013, the entire disclosure of which is incorporated herein by reference.

[1] An optical material of which a transmittance curve measured at a thickness of 2 mm of the optical material has a minimum transmittance value in a wavelength range of 445 nm to 470 nm.

[2] The optical material according to [1], of which the transmittance curve measured at a thickness of 2 mm of the optical material satisfies the following characteristics (1) to (4), in which (1) the transmittance curve has a maximum transmittance value in a wavelength range of 400 nm to 440 nm and the maximum transmittance thereof is 50% or more, in which (2) the transmittance curve has a minimum transmittance value in a wavelength range of 445 nm to 470 nm, in which (3) the transmittance at a wavelength of 500 nm is 70% or more, and in which (4) the minimum transmittance value in the wavelength range of 445 nm to 470 nm is four-fifths or less of the transmittance at a wavelength of 500 nm.

[3] The optical material according to [1] or [2], including:
at least one kind of organic dyes which have an absorption peak in a wavelength range of 445 nm to 470 nm, in an absorption spectrum which is measured at an optical path length of 10 mm of a chloroform solution thereof at a concentration of 0.01 g/L, and the half-value width of the absorption peak is 10 nm or more and less than 50 nm.

[4] The optical material according to [1] or [2], including:
organic dyes which have an absorption peak in a range of 445 nm to 455 nm and organic dyes which have an absorption peak in a range of 460 nm to 470 nm, in an absorption spectrum which is measured at an optical path length of 10 mm of a chloroform solution thereof at a concentration of 0.01 g/L.

[5] The optical material according to [3],
in which the organic dyes are comprised of at least one kind of compound selected from porphyrin-based compounds represented by the following General Formula (A).

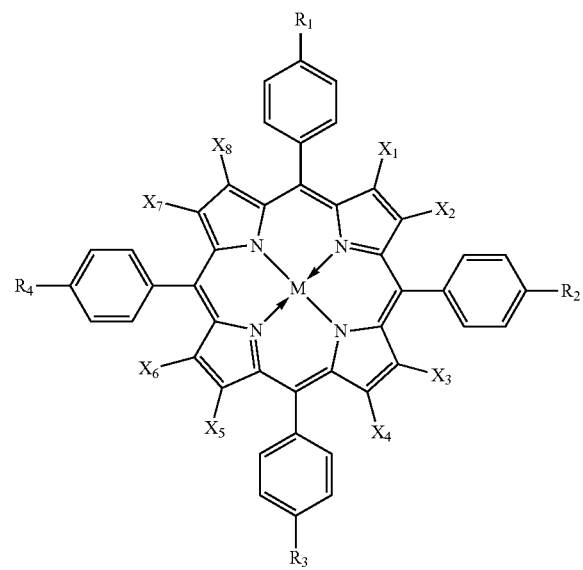

(A)

In the formula, $X_1$ to $X_8$ each independently represents a hydrogen atom; and a halogen atom. However, not all of $X_1$ to $X_8$ are hydrogen atoms. $R_1$ to $R_4$ each independently represents a hydrogen atom; and a straight or branched alkyl group. M represents two hydrogen atoms, a divalent metal atom, a trivalent substituted metal atom, a tetravalent substituted metal atom, a hydroxylated metal atom, or an oxidized metal atom.

[6] The optical material according to any one of [1] to [5], including:
at least one kind selected from polyurethane, polythiourethane, polysulfide, polycarbonate, poly(meth)acrylate, and polyolefin.

[7] A composition for an optical material including:
a resin for an optical material or a resin monomer; and
at least one kind of porphyrin-based compounds represented by the following General Formula (A) as organic dyes.

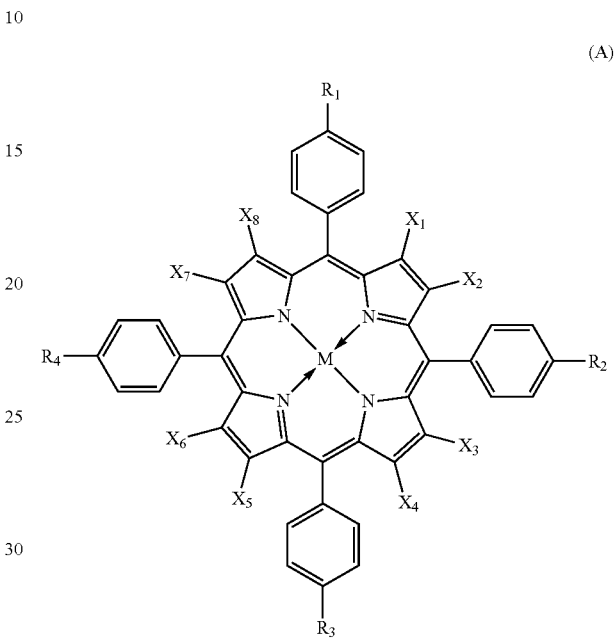

(A)

In the formula, $X_1$ to $X_8$ each independently represents a hydrogen atom; and a halogen atom. However, not all of $X_1$ to $X_8$ are hydrogen atoms. $R_1$ to $R_4$ each independently represents a hydrogen atom; and a straight or branched alkyl group. M represents two hydrogen atoms, a divalent metal atom, a trivalent substituted metal atom, a tetravalent substituted metal atom, a hydroxylated metal atom, or an oxidized metal atom.

[8] The composition for an optical material according to [7],
in which the resin for an optical material is at least one kind selected from polyurethane, polythiourethane, polysulfide, polycarbonate, poly(meth)acrylate, and polyolefin.

[9] A process for producing a molded product, including:
a step of obtaining the composition for an optical material according to [7] or [8] by mixing the organic dyes with the resin for an optical material or the resin monomer; and
a step of curing the composition for an optical material.

[10] A molded product which is obtained by molding the composition for an optical material according to [7] or [8].

[11] An optical material comprised of the molded product according to [10].

[12] A plastic spectacle lens comprised of the optical material according to any one of [1] to [6] and [11].

[13] A plastic spectacle lens,
in which a lens base material is comprised of the optical material according to any one of [1] to [6] and [11].

[14] A film comprised of the molded product according to [10].

[15] A plastic spectacle lens, including:
a film layer over at least one surface of a lens base material, in which the film layer is comprised of the film according to [14].

[16] A plastic spectacle lens, including:
a coating layer over at least one surface of a lens base material,
wherein the coating layer is comprised of the composition for an optical material according to [7] or [8].

The invention claimed is:

1. An optical material in which a transmittance curve measured at a thickness of 2 mm thereof satisfies the following characteristics (1) to (4),
   wherein (1) the transmittance curve has a local maximum transmittance value in a wavelength range of 400 nm to 440 nm and the maximum transmittance thereof is 50% or more,
   wherein (2) the transmittance curve has a minimum transmittance value in a wavelength range of 445 nm to 470 nm,
   wherein (3) the transmittance at a wavelength of 500 nm is 70% or more, and
      wherein (4) the minimum transmittance value in the wavelength range of 445 nm to 470 nm is four-fifths or less of the transmittance at a wavelength of 500 nm,
   wherein the optical material comprises a polythiourethane and organic dyes,
   wherein the organic dyes are comprised of at least two selected from porphyrin-based compounds represented by the General Formula (A):

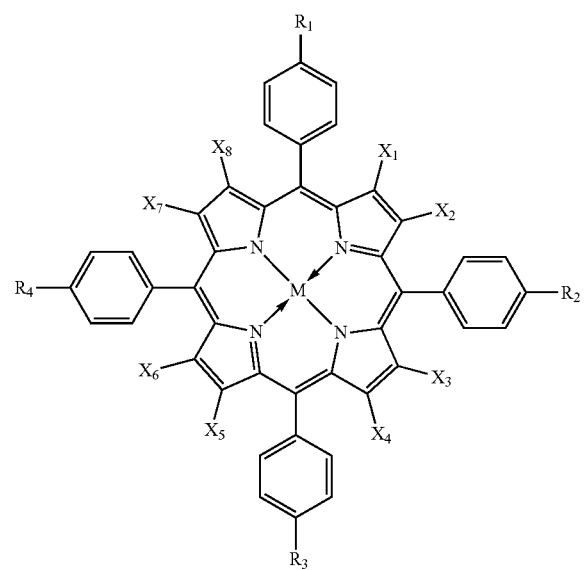

(A)

wherein all of $X_1$ to $X_8$ represent bromine atoms; $R_1$ to $R_4$ each independently represents a hydrogen atom, and a straight or branched alkyl group; and M represents two hydrogen atoms, a divalent metal atom, a trivalent substituted metal atom, a tetravalent substituted metal atom, a hydroxylated metal atom, or an oxidized metal atom, and wherein the amount of the organic dyes is 5 ppm to 100 ppm.

2. The optical material according to claim 1, comprising:
at least one kind of organic dyes which have an absorption peak in a wavelength range of 445 nm to 470 nm, in an absorption spectrum which is measured at an optical path length of 10 mm of a chloroform solution thereof at a concentration of 0.01 g/L, and the half-value width of the absorption peak is 10 nm or more and less than 50 nm.

3. The optical material according to claim 1, comprising:
organic dyes which have an absorption peak in a wavelength range of 445 nm to 455 nm and organic dyes which have an absorption peak in a wavelength range of 460 nm to 470 nm, in an absorption spectrum which is measured at an optical path length of 10 mm of a chloroform solution thereof at a concentration of 0.01 g/L.

4. The optical material according to claim 1, the optical material has a minimum transmittance value in a wavelength range of 455 nm to 465 nm.

5. The optical material according to claim 1,
wherein the organic dyes have an absorption peak in a wavelength range of 445 nm to 470 nm, in an absorption spectrum which is measured at an optical path length of 10 mm of a chloroform solution thereof at a concentration of 0.01 g/L.

6. A plastic spectacle lens comprised of the optical material according to claim 1.

7. A plastic spectacle lens, comprising:
a lens base material comprised of the optical material according to claim 1.

* * * * *